United States Patent
Taguchi et al.

(10) Patent No.: US 6,509,763 B2
(45) Date of Patent: Jan. 21, 2003

(54) SEMICONDUCTOR DEVICE USING COMPLEMENTARY CLOCK AND SIGNAL INPUT STATE DETECTION CIRCUIT USED FOR THE SAME

(75) Inventors: Masao Taguchi, Kawasaki (JP);
Hiroyoshi Tomita, Kawasaki (JP);
Yasurou Matsuzaki, Kawasaki (JP);
Miki Yanagawa, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 10/162,565

(22) Filed: Jun. 6, 2002

(65) Prior Publication Data

US 2002/0153933 A1 Oct. 24, 2002

Related U.S. Application Data

(60) Division of application No. 09/978,022, filed on Oct. 17, 2001, now Pat. No. 6,424,199, which is a division of application No. 09/780,475, filed on Feb. 12, 2001, now Pat. No. 6,333,660, which is a division of application No. 09/556,948, filed on Apr. 21, 2000, now Pat. No. 6,225,841, which is a continuation of application No. 09/076,810, filed on May 13, 1998, now Pat. No. 6,104,255, which is a continuation-in-part of application No. 08/937,517, filed on Sep. 25, 1997, now abandoned.

(30) Foreign Application Priority Data

Apr. 21, 1997 (JP) ............................... 9-103375
Mar. 11, 1998 (JP) ........................... 10-059429

(51) Int. Cl.[7] ............................................. G01R 19/00

(52) U.S. Cl. ....................................................... 327/58

(58) Field of Search ............................. 327/18, 20, 58, 327/62, 69, 80, 81

(56) References Cited

U.S. PATENT DOCUMENTS

| 4,446,389 A | 5/1984 | Williams et al. ............ 307/515 |
| 4,648,021 A | 3/1987 | Alberkrack ................. 363/157 |
| 4,795,971 A * | 1/1989 | Murao ......................... 324/102 |
| 4,982,116 A | 1/1991 | Lee ............................. 307/480 |

(List continued on next page.)

FOREIGN PATENT DOCUMENTS

EP          0 647 898          4/1995

OTHER PUBLICATIONS

Patent Abstracts of Japan, vol. 014, No. 444, Sep. 21, 1990 of JP 02–174421, Nec Corporation, Jul. 5, 1990.

(List continued on next page.)

*Primary Examiner*—Jeffrey Zweizig
(74) *Attorney, Agent, or Firm*—Arent Fox Kintner Plotkin & Kahn, PLLC.

(57) ABSTRACT

A semiconductor device for generating first and second internal clocks complementary with each other from an external clock and usable for both a system of a type using a complementary clock and a system of a type generating a 180° phase clock internally, is disclosed. A first clock input circuit (buffer) is supplied with a first external clock and outputs a first internal clock. A second clock input circuit (buffer) is supplied with a second external clock complementary with the first external clock and outputs a second clock. A ½ phase clock generating circuit generates a ½ phase shift signal 180° out of phase with the first internal clock. A second external clock state detection circuit judges whether the second external clock is input to the second clock input buffer. A switch is operated to produce the second clock as the second internal clock when the second external clock is input and to produce the ½ phase shift signal as the second internal clock when the second external clock is not input, in accordance with the judgement at the second external clock state detection circuit.

1 Claim, 37 Drawing Sheets

U.S. PATENT DOCUMENTS

| | | | | |
|---|---|---|---|---|
| 5,003,196 A | * | 3/1991 | Kawaguchi | 327/205 |
| 5,101,127 A | | 3/1992 | Simpson | 307/518 |
| 5,365,181 A | | 11/1994 | Mair | 327/116 |
| 5,631,584 A | * | 5/1997 | Smith | 327/58 |
| 6,016,283 A | | 1/2000 | Jeong | 365/233 |

OTHER PUBLICATIONS

Patent Abstracts of Japan, vol. 013, No. 437, Sep. 29, 1989 of JP 01–164142, Fujitsu Limited, Jun. 28, 1989.

Patent Abstracts of Japan, vol. 010, No. 011, Jan. 17, 1986 of JP 60–173949, Fujitsu Ltd., Sep. 7, 1985.

\* cited by examiner

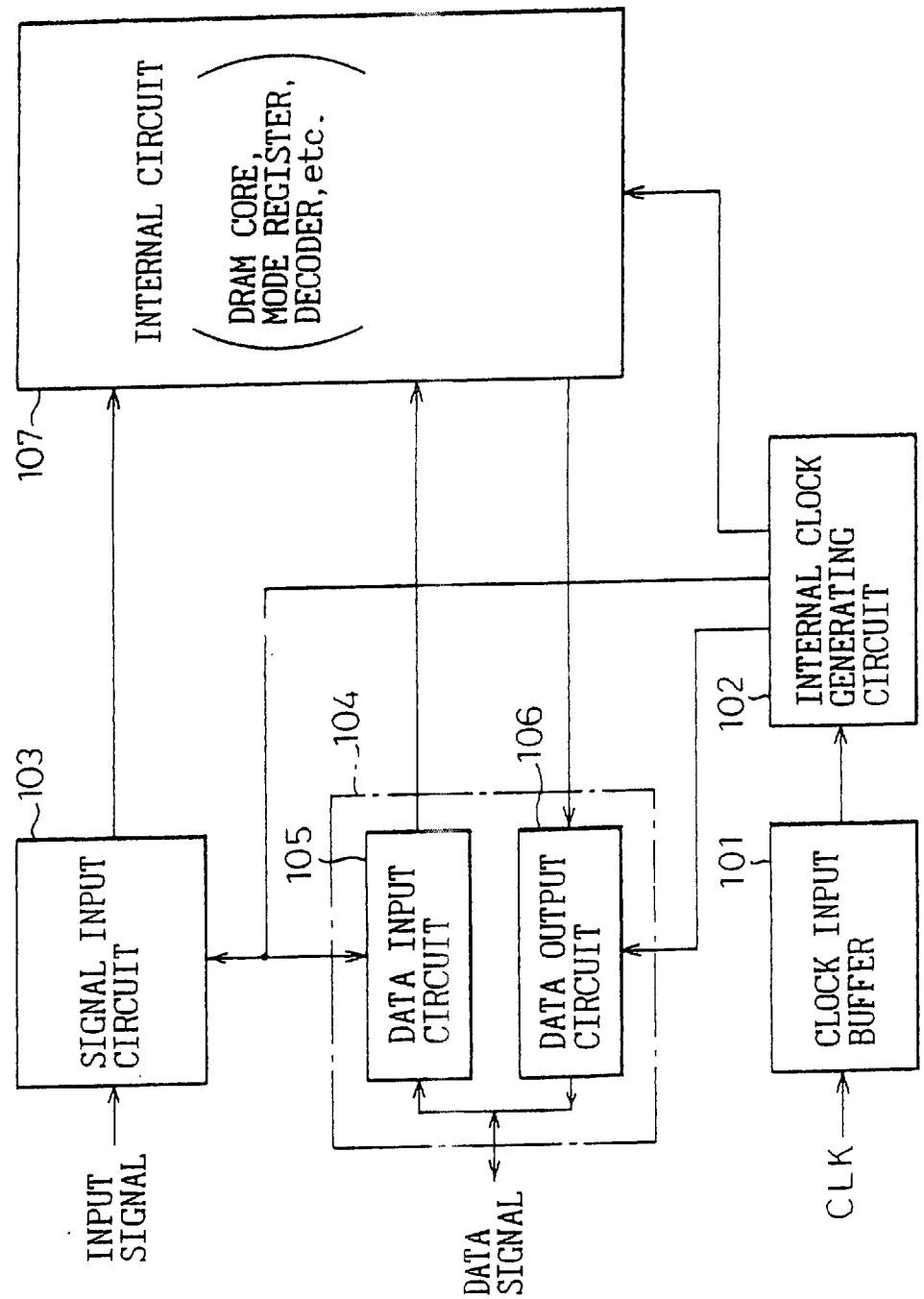

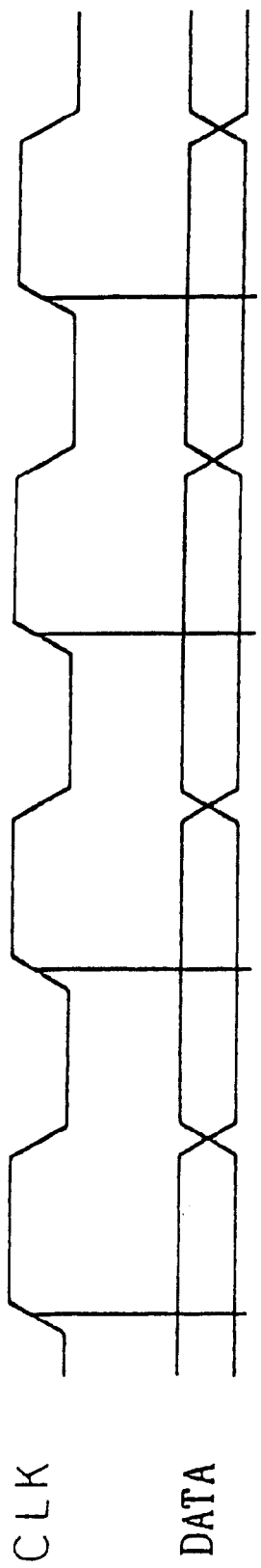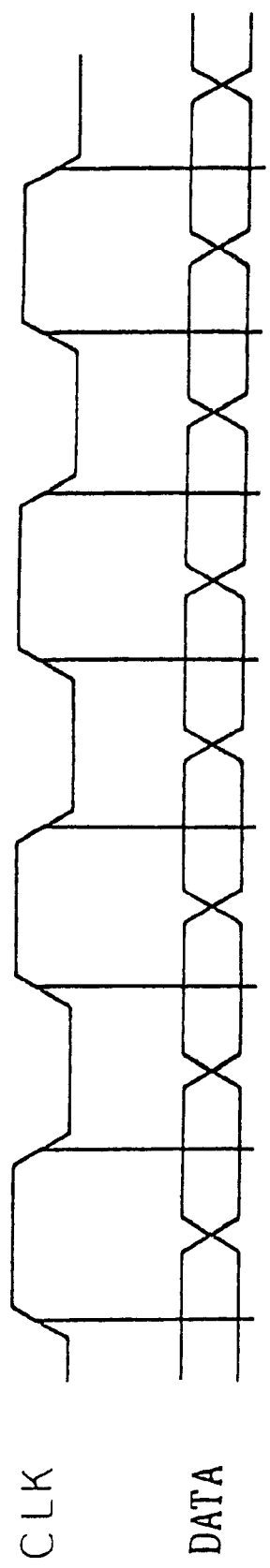

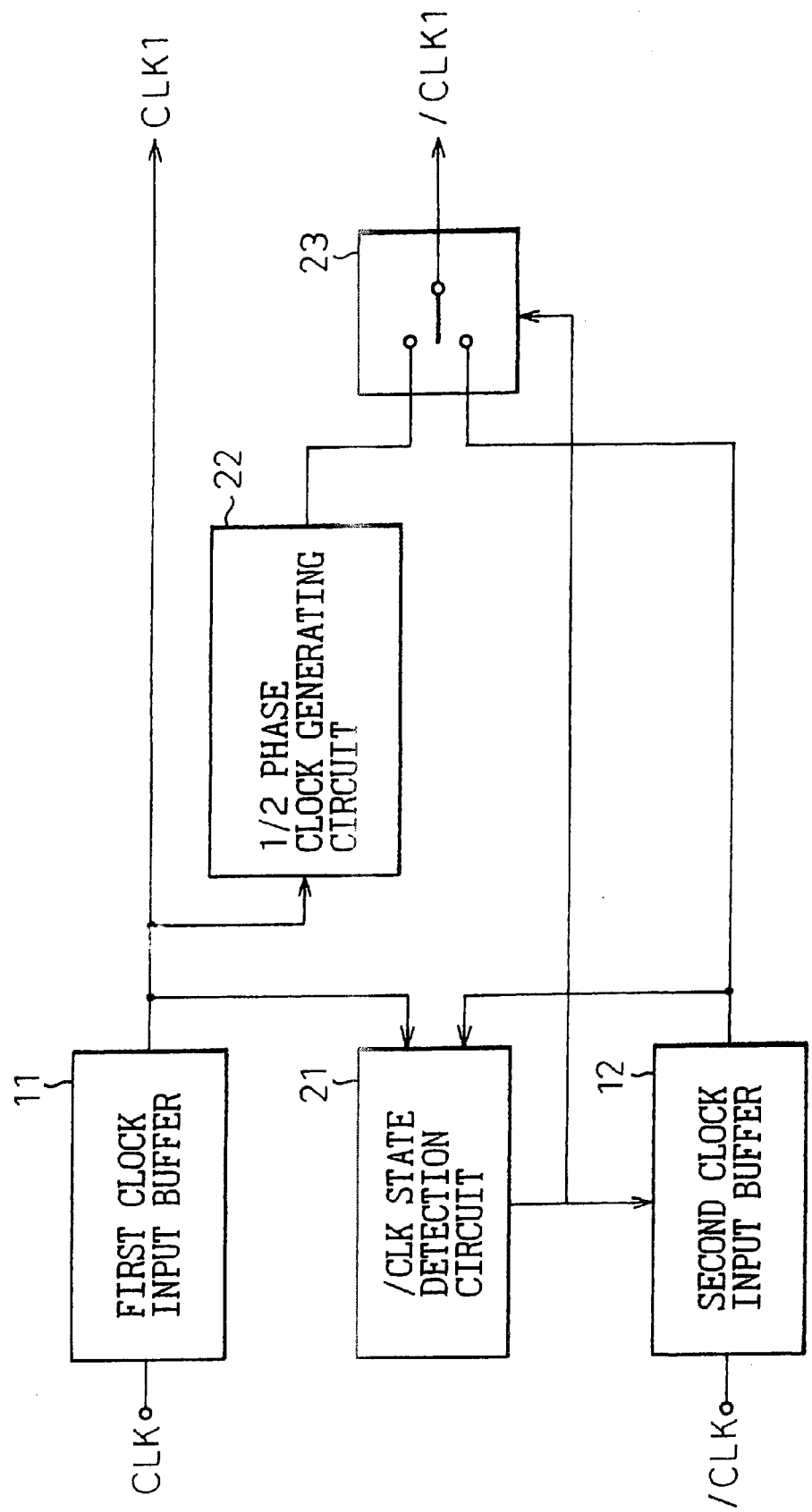

SEMICONDUCTOR DEVICE USING COMPLEMENTARY CLOCK AND SIGNAL INPUT STATE DETECTION CIRCUIT USED FOR THE SAME

CROSS REFERENCE TO RELATED APPLICATION

This is a Division of application Ser. No. 09/978,022, filed Oct. 17, 2001, application of prior application Ser. No. 09/978,022, filed Oct. 17, 2001, U.S. Pat. No. 6,424,199 which is a division of application Ser. No. 09/780,475, filed Feb. 12, 2001, U.S. Pat. No. 6,333,660 which is a division of application Ser. No. 09/556,948 (U.S. Pat. No. 6,225,841) filed Apr. 21, 2000 which is a continuation of application Ser. No. 09/076,810, filed May 13, 1998 U.S. Pat. No. 6,104,225) which is a continuation-in-part of application Ser. No. 08/937,517, filed Sep. 25, 1997 now abandoned.

BACKGROUND OF THE INVENTION

1. Field of the Invention

The present invention relates to a semiconductor device comprising an internal clock generating circuit for receiving an external clock and generating an internal clock, and more in particular to a semiconductor device comprising an internal clock generating circuit for generating a first internal clock (CLK1) in phase with an external clock and a second internal clock 180° out of phase (shifted by one-half of a phase) from the external clock.

2. Description of the Related Art

In a system comprising a combination of a plurality of semiconductor devices, it is a common practice to synchronize the operations of the various parts with a clock. For this reason, semiconductor devices other than the one which generates and outputs an original clock include an internal clock generating circuit which receives the clock output from other semiconductor devices and generates an internal clock used for the internal parts thereof. A description herein will be made of a synchronized dynamic random access memory (SDRAM) as an example which performs signal input and output operations with external sources and an internal operation in synchronism with a clock. The present invention, however, is not limited to the SDRAM.

In recent years, a demand has increased for an improved data transfer rate of the SDRAM, and the clock frequency has greatly increased. With an increased clock frequency, however, the problem of the signal deterioration, etc. is posed. As described above, the data signal changes in accordance with the period of the clock, and the frequency of the data signal is one half that of the clock. In view of this, a DDR (double data rate) technique has been proposed, in which the data signal is set to the same frequency as the clock and is retrieved in synchronism with both the leading and trailing edges of the clock.

In the DDR technique, the ideal phase difference between the leading and trailing edges of a clock CLK is 180°. The external clock actually retrieved, however, often has a phase difference other than 180° between the leading and trailing edges due to the load of the signal line, etc. Also, the characteristics of the internal clock generating circuit frequently causes the internal clock to have a phase difference other than 180° between the leading and trailing edges thereof. The resulting problem is that if a data signal is retrieved or the internal circuit is operated in synchronism with the leading and trailing edges of the internal clock, the time margin for normal operation cannot be satisfied.

In employing the DDR technique, one solution to the above-mentioned problem would be for the transmitting end of the signal to output a first clock CLK and a second clock /CLK 180° out of phase in complementary relation with each other and for the receiving end of the signal to retrieve the signal in synchronism with the leading edges of CLK and /CLK. Another solution to the problem would be to generate a second internal clock exactly 180° out of phase with the external clock CLK in the SDRAM using the delay locked loop (DLL) or the like technique from the external clock CLK.

A SDRAM could thus be fabricated incorporating one of the two types of internal clock generating circuits (clock input circuits) depending on the technique used for the system on which it is mounted. In other words, two types of SDRAM could be fabricated, one exclusively using a complementary clock, and the other for exclusively generating a 180° clock internally.

Nevertheless, analogous semiconductors having two different specifications would be fabricated at a higher cost due to a lower production efficiency and an inefficient inventory control. The manufacturer which produced a system using such a device would also suffer from an increased cost due to an increased stockpile. Thus, a device is desirable which can be used for both a system using a complementary clock and a system which generates a 180° phase clock internally.

Also, with the increase in frequency, the delay of the internal clock of the semiconductor device increases to a significant extent. For example, the layout of a semiconductor sometimes makes it necessary to arrange a data input circuit and a data output circuit at a distance from an internal clock generation circuit. In such a case, the internal clock supplied from the internal clock generation circuit to the data input circuit or the data output circuit is delayed, which causes a deviation of the data input or output operation. Also, some delay is unavoidable in the clock input buffer and the internal clock generation circuit. As long as the clock frequency is not high, such a delay poses no substantial problem. With the increase in clock frequency to 100 MHz or more, however, the situation is aggravated to a significant extent. In order to solve this problem, the present applicant proposes, in U.S. Copending applications Ser. Nos. 08/892,790 and 08/924,705, a method for completely synchronizing the internal clock supplied to the data input circuit and the data output circuit with an external clock using a variable delay line having the delay amount thereof changeable. These applications do not disclose a semiconductor device operating according to a DDR (double data rate) scheme which uses a complementary clock. It has been desired also in a DDR semiconductor that the data input/output operation can be performed totally in synchronism with an external clock.

SUMMARY OF THE INVENTION.

The present invention is intended to solve this problem, the first object thereof is to provide a semiconductor device usable for both a DDR type system using a complementary clock and a system generating a 180° phase internally at the same time, and the second object thereof is to provide a DDR type semiconductor device of which data input/output operations are perfectly synchronized with an external clock.

According to the present invention, there is provided a semiconductor device comprising means for generating a first internal clock and a second internal clock complementary with each other from an external clock, a first clock input circuit (buffer) supplied with a first external clock for producing a first internal clock, a second clock input circuit (buffer) supplied with a second external clock complementary with the first external clock for producing a second clock, a ½ phase clock generating circuit for generating a ½ phase shift signal having a phase 180° different from the first internal clock, a second external clock state detection circuit for judging whether the second external clock is input to the second clock input buffer, and a switch for producing the second clock as a second internal clock in the presence of an input of the second external clock and for producing the ½ phase shift signal as a second internal clock in the absence of an input of the second external clock in accordance with the result of judgement at the second external clock state detection circuit.

In the semiconductor device according to this invention, the signal generated from the second external clock is produced as a second internal clock when the second external clock is input thereto, and a ½ phase shift signal 180° out of phase with the first internal clock is produced as a second internal clock when the second external clock is not input thereto. The semiconductor device according to this invention, therefore, can meet the requirements of the two types of the system at the same time.

When the ½ phase shift signal is output as the second internal clock in the absence of the second external clock applied thereto, the second clock input circuit need not be operated. The second clock input circuit, therefore, is desirably turned off to save power in such a case.

Also, as long as the second external clock is input, the ½ phase clock generating circuit need not to be operated. Therefore, the ½ phase clock generating circuit is desirably turned off to save power. In such a case, the ½ phase clock generating circuit, if the first internal clock is not being supplied thereto, is substantially turned off.

The ½ phase clock generating circuit is made up of a PLL circuit or a delay locked loop (DLL) having a delay line of which the delay amount is selectable in predetermined units of delay.

Various methods are conceivable for realizing the /CLK state detection circuit. In an example configuration, a switching edge of the second clock is detected, so that upon detection of the switching of the second clock, application of the second external clock is judged. In another possible configuration, the voltage of an input pin supplied with the second external clock is fixed to Vcc or Vss, or upon detection that the input pin is open, the absence of the second external clock input is judged. The frequency of the second clock is so high that the switching edge thereof is difficult to detect. Therefore, the /CLK state detection circuit preferably includes a frequency divider to detect the switching edge of the second clock with a longer period than that of the second external clock.

The /CLK state detection circuit is for detecting whether or not the second external clock is input within a predetermined length of time after power is switched on and for subsequently maintaining the judgement, or normally detects the presence or absence of an input of the second external clock.

In the case where a signal of small amplitude is input as a clock signal, the invention may comprise a signal input state detection circuit including a first inverter, a second inverter and a logical circuit as a /CLK state detection circuit. The first inverter includes a first P-channel transistor and a first N-channel transistor connected in series between a high-voltage terminal and a low-voltage terminal of a power supply, wherein the gates of the first P-channel transistor and the first N-channel transistor are impressed with a small-amplitude signal, and the gate width of the first P-channel transistor is sufficiently larger than the gate width of the first N-channel transistor. The second inverter includes a second P-channel transistor and a second N-channel transistor connected in series to each other between the high-voltage terminal and the low-voltage terminal of the power supply, wherein a small-amplitude signal is applied to the gates of the second P-channel transistor and the second N-channel transistor, and the gate width of the second N-channel transistor is sufficiently larger than the gate width of the second P-channel transistor. The logical circuit produces an active signal indicating that a small-amplitude signal is applied upon detection that the output of the first inverter assumes a logical value approximate to the potential of the high-voltage terminal and that the output of the second inverter assumes a logical value approximate to the potential of the low-voltage terminal.

According to a second aspect of the invention, in order to achieve the above-mentioned object, there is provided a semiconductor device regulated in such a manner that first and second external clocks, which are complementary with each other, are in phase with first and second internal clocks, respectively.

Specifically, a semiconductor device according to the second aspect of the invention, which is supplied with first and second external clocks, which are complementary with each other, from an external source, comprises a first clock input circuit supplied with the first external clock for outputting the first internal clock, a second clock input circuit supplied with the second external clock for outputting the second internal clock, a first 0° phase adjusting circuit for adjusting the first internal clock into synchronism with the first external clock, and a second 0° phase adjusting circuit for adjusting the second internal clock into synchronism with the second external clock.

In the case where a clock signal having a frequency twice that of the external clocks is required, the semiconductor device further comprises a synthesizer for combining the outputs of the first 0° phase adjusting circuit and the second 0° phase adjusting circuit and producing an internal clock twice higher in frequency than the first and second external clocks.

The first and second 0° phase adjusting circuits each include a variable delay circuit for delaying the internal clocks in variable way, and a phase difference detection circuit for detecting the phase difference between the external clock and the clock signal supplied by the clock output of the variable delay circuit and generating a control signal for controlling the delay amount of the variable delay circuit in such a manner as to secure a phase difference of 0°.

The phase difference detection circuit can either detect the phase difference using an actual signal in the route for supplying the external clock from the clock input circuit through the variable delay circuit or can comprise a dummy circuit equivalent to the particular route for detecting the phase difference with an equal delay amount. Also, the phase difference can be detected when the route is partly constituted with a dummy circuit.

As long as the first internal clock and the second internal clock are out of phase by one half period (180°) exactly from each other, the first phase difference detection circuit and the second phase difference detection circuit can be combined into a common circuit.

In similar fashion, in the case where the first internal clock and the second internal clock are out of phase from each other by one half period (180°) exactly, a 0° phase adjusting circuit can be provided in which the internal clock combined from the first and second internal clocks and output from the synthesizer is in phase with the first external clock or the second external clock.

The 0° phase adjusting circuit includes a variable delay circuit for delaying the internal clock by a variable amount, and a phase difference detection circuit for detecting the phase difference between the first or second external clock and the clock signal output from the variable delay circuit delayed by an amount equivalent to the distance from the first clock input circuit or the second clock input circuit to the synthesizer and generating a control signal for controlling the delay amount in the variable delay circuit in such a manner as to secure a phase difference of 0°.

Also in this case, the phase difference detection circuit can either detect the phase difference using an actual signal in the route for supplying the external clock from the clock input circuit through the variable delay circuit or can detect the phase difference by causing an equal delay amount using a dummy circuit equivalent to the route

BRIEF DESCRIPTION OF THE DRAWINGS

The present invention will be more clearly understood from the description as set below with reference to the accompanying drawings, wherein:

FIG. 1 is a diagram showing a general configuration of a SDRAM;

FIGS. 2A and 2B are diagrams showing the data input operation of the SDRAM;

FIG. 4 is a diagram showing a basic configuration of the present invention;

DESCRIPTION OF THE PREFERRED EMBODIMENTS

Figure 3A:
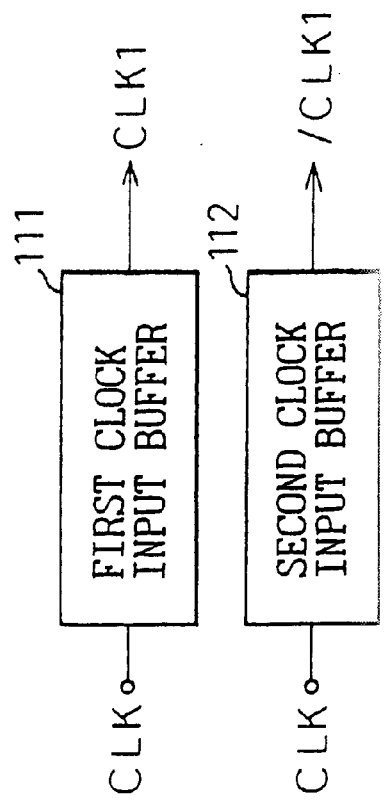
FIGS. 3A and 3B are diagrams showing a conventional circuit for generating a complementary clock.

Before proceeding to a detailed description of the preferred embodiments of the present invention, a prior art internal clock generating circuit of a synchronous dynamic random access memory (SDRAM) will be described with reference to the accompanying drawings relating thereto for a clearer understanding of the differences between the prior art and the present invention.

FIG. 1 is a diagram showing a general configuration of a SDRAM. The SDRAM increases the speed of the input/ output operation of the data signal by pipelining the internal operation in synchronism with a clock. As a result, as shown in FIG. 1, the SDRAM includes an internal clock generating circuit 102 for generating an internal clock from an external clock applied to a clock buffer 101. The internal clock generated by the internal clock generating circuit 102 is applied to an internal circuit 107 having a DRAM core, a mode register, a decoder, etc., a data input/output buffer 104 having a data input circuit 105 and a data output circuit 106, and a signal input circuit 103 impressed with signals other than the data signal. In this way, these component parts are controlled to operate in synchronism with each other.

FIGS. 2A and 2B are diagrams showing the input operation of the data signal for the SDRAM. As shown in FIG. 2A, the data signal to be written in the SDRAM is applied in synchronism with an external clock CLK. The data input circuit 105 latches the data signal in synchronism with the internal clock supplied thereto from the internal clock generating circuit 102 and retrieves the signal into the SDRAM, As shown, the data signal undergoes a change in synchronism with the trailing edge of the external clock CLK. Therefore, the internal clock generating circuit 102 applies the same internal clock as the external clock CLK to the data input circuit 105, which in turn retrieves the input data in synchronism with the leading edge of the external clock CLK. In other words, the data signal undergoes a change for each period of the external clock CLK. This is also the case with the data signal output from the SDRAM, which undergoes a change for each period of the external clock CLK.

Figure 3B:
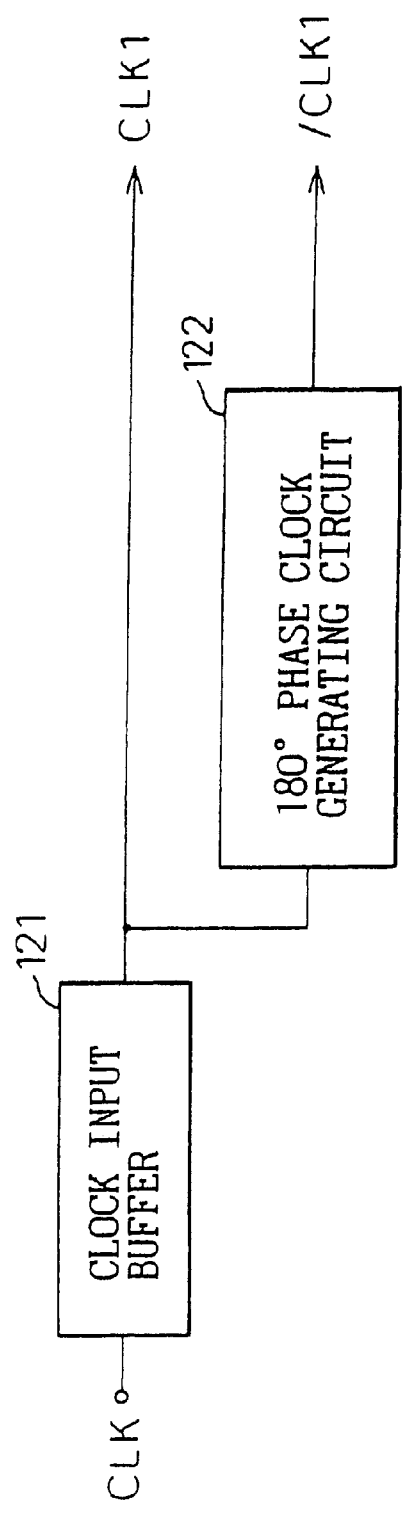

In recent years, a DDR (double data rate) technique has been proposed, in which a data signal is set as a signal having the same frequency as a clock and retrieved in synchronism with both the leading edge and the trailing edge of the clock. FIG. 2B is a diagram showing, the data signal input operation according to the DDR technique. As shown in FIG. 2B, the DDR technique secures an ideal phase difference of 180° between the leading edge and the trailing edge of the clock CLK. In a method employing the DDR technique, therefore, the transmitting end of the signal outputs a first clock CLK and a second clock /CLK 180° out of phase in complementary relation with each other, while the receiving end of the signal retrieves the signal in synchronism with the leading edges of the CLK and /CLK signals. In such a case, as shown in FIG. 3A, the SDRAM generates a first internal clock CLK1 in response to a first clock CLK received at a first clock buffer 111, and generates a second internal clock /CLK1 in response to a second clock /CLK received at a second clock buffer 112. Another method which can be employed consists in generating a second internal clock exactly 180° out of phase with the external clock CLK within the SDRAM using the technique such as the delay locked loop (DLL). In this case, as shown in FIG. 3B, the first clock CLK is received by the clock buffer 121 thereby to generate a first internal clock CLK1, and a 180° phase clock generating circuit 122 generates a second internal clock /CLK1 180° out of phase.

A SDRAM is thus fabricated incorporating one of the internal clock generating circuits (clock input circuits) shown in (A) and (B) of FIG. 3 depending on the technique employed for the system on which the SDRAM is mounted. Specifically, two types of SDRAM are fabricated, one exclusively using a complementary clock, and the other exclusively generating a 180° phase clock internally.

FIG. 4 is a diagram showing a basic configuration of the present invention. As shown in FIG. 4, a semiconductor device according to this invention comprises means for generating a first internal clock CLK1 and a second internal clock /CLK1 complementary with each other from an external clock, a first clock input circuit (buffer) supplied with the first external clock CLK for producing the first internal clock CLK1, a second clock input circuit (buffer) 12 supplied with a second external clock /CLK complementary with the first external clock CLK for producing a second clock, a ½ phase clock generating circuit 22 for generating a ½ phase shift signal having a phase 180° out of phase with the first internal clock CLK1, a /CLK state detection circuit 21 for judging whether the second external clock /CLK is applied to the second clock input buffer 12, and a switch 23 for producing the second clock as the second internal clock /CLK1 in the presence of the second external clock /CLK applied thereto and for producing the ½ phase shift signal as The second internal clock /CLK1 in the absence of the second external clock /CLK applied thereto in accordance with the result of judgement at the /CLK state detection circuit 21.

In the semiconductor device according to this invention, as long as the second external clock /CLK is applied, the signal generated from the second external clock /CLK is produced as a second internal clock, and as long as the second external clock /CLK is not applied, a ½ phase shift signal 180° out of phase generated from the first internal clock CLK1 is output as the second internal clock. Thus, a semiconductor device according to this invention can meet the requirements of both types of system described above.

Figure 5:
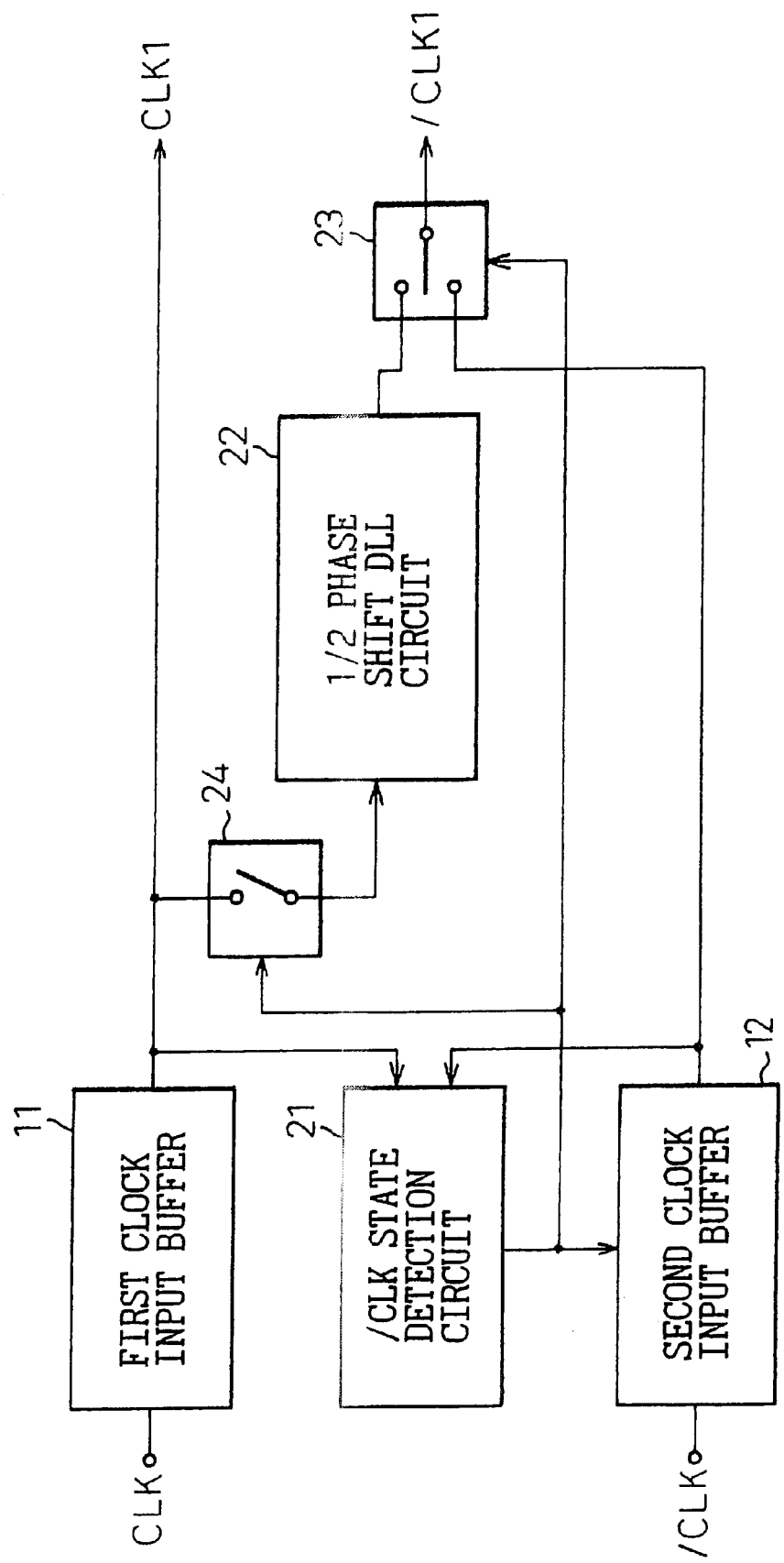
FIG. 5 is a diagram showing a configuration of an internal clock generating circuit of a SDRAM according to a first embodiment of the invention.

FIG. 5 is a diagram showing a configuration of an internal clock generating circuit of a semiconductor device according to a first embodiment of the invention. As shown, the circuit of the first embodiment further comprises a switch 24 in addition to the configuration of FIG. 4, and realizes the ½ phase clock generating circuit of FIG. 4 as a DLL circuit. Each part will be explained below.

Figure 6:
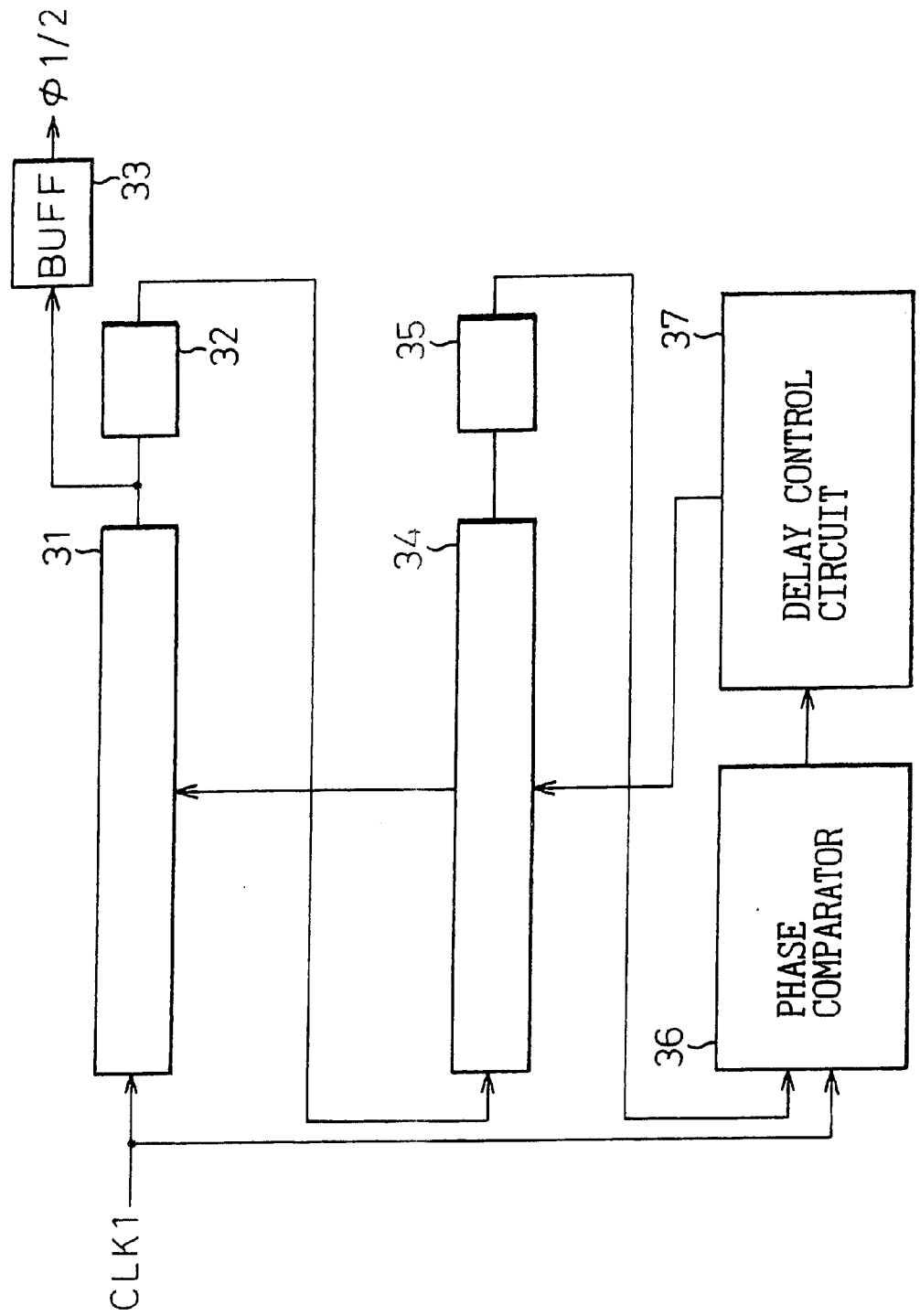
FIG. 6 is a diagram showing a configuration of a ½ phase shift DLL circuit according to the first embodiment.
Figure 7:
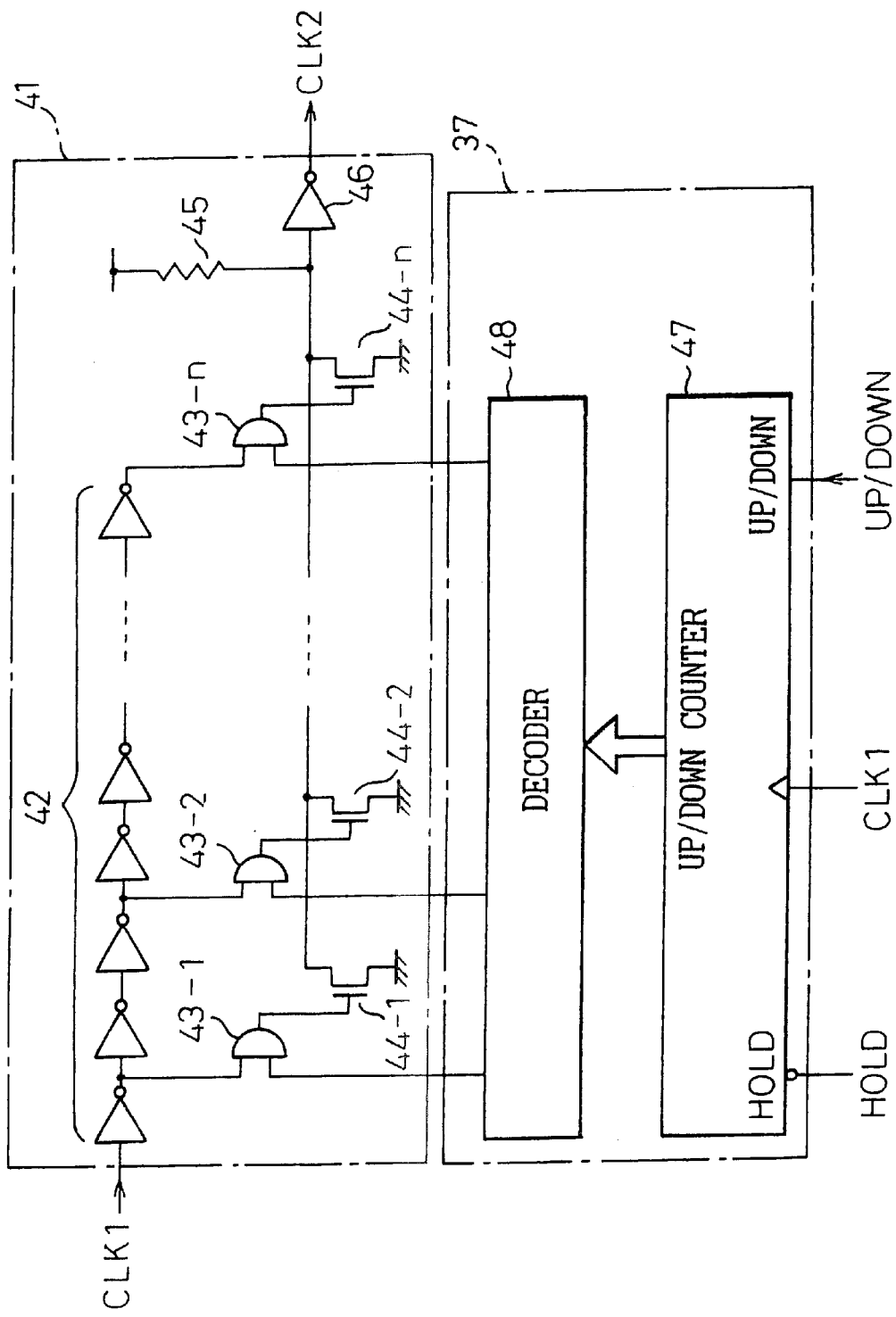
FIG. 7 is a diagram showing an example configuration of a delay circuit and a delay control circuit according to the first embodiment.

FIG. 6 is a diagram showing a general circuit configuration of the ½ phase shift DLL circuit 22. As shown in FIG. 6, the ½ phase shift DLL circuit 22 includes first and second delay circuits 31, 34 having the same configuration, buffer circuits 32, 33, 35 having the same configuration, a phase comparator circuit 36, and a delay control circuit 37 for adjusting the amount of delay of the delay circuits 31, 34 on the basis of the judgement of the phase comparator circuit 36. The delay circuits 31, 34 and the delay control circuit 37 have a circuit configuration as shown in FIG. 7. First, the delay circuit and the delay control circuit will be explained.

In FIG. 7, only one of the delay circuits 31, 34 is designated by reference numeral 41, and the other delay circuit is not shown. The delay circuits 31 and 34 have the same configuration, and are adjusted to have the same amount of delay by the control signal from the delay control circuit 37. As shown, the delay circuit 41 includes an inverter string 42 having a plurality of inverters connected in series, an AND gate string including a plurality of AND gates 43-1, 43-2, . . . , 43-n adapted in such a manner that one of the inputs thereof receives the output of each two stages of the inverter string 42, a transistor string including N-channel transistors 44-1, 44-2, . . . , 44-n with the gates thereof supplied with the output of each AND gate, the sources grounded and the drains connected in common, a resistor 45 inserted between a signal line connected with the drains of the N-channel transistors in common and the high-potential side of the power supply, and a buffer 46 within input terminal thereof connected to the signal line for producing an internal clock CLK2. The delay control circuit 37 includes an up-down counter 47 for switching between count-up and count-down in accordance with the result of comparison at the phase comparator circuit 36 and a decoder 48 for decoding the output of the up/down counter 47. The up/down counter 47 reduces a HOLD signal to L as required and thereby is capable of holding the count value. When the HOLD signal is H and the first internal clock CLK1 rises, the count-up or count-down operation is performed in accordance with the UP/DOWN signal produced by the phase comparator circuit 36 based on the result of comparison. The decoder 48 raises one of the outputs to H and reduces the other outputs to L in accordance with the output of the up/down counter 47. In the case where the up/down counter 47 counts up, the output position of H is shifted rightward, while when the up-down counter 47 counts down, the output position of H is shifted leftward. The output of the decoder 48 is connected to the other input terminal of each of the AND gates 43-1, 43-2, . . . , 43-n. Only those AND gates which are impressed with a H signal from the decoder 48 are turned on. The signal input to the AND gate thus turned on among all the outputs of the inverter string is output as an internal clock CLK2. Since the number of stages of the inverter string through which the signal passes is varied depending on the AND gates turned on, the amount of delay of the internal clock can be selected.

As described above, the delay circuits 31 and 34 are adapted to select the amount of delay in steps under the control of the delay control circuit 37. In addition, the amount of delay is the same for the delay circuits 31 and 34. Also, the buffer circuits 32 and 35 have the same configuration, so that the delay amount through the delay circuit 31 and the buffer circuit 32 is identical to the delay amount through the delay circuit 34 and the buffer circuit 35. The phase comparator circuit 36 compares the output of the buffer circuit 35 with the first internal clock CLK1 input to the delay circuit 31, and outputs an up/down signal to the delay control circuit 37 in accordance with the result of comparison. Specifically, when the phase of the first internal clock CLK1 is delayed behind the phase of the output of the buffer circuit 35, the up/down signal is raised to H thereby to increase the amount of delay through the delay circuits 31 and 34. In the case where the phase of the first internal clock CLK1 is in advance of the phase of the output of the buffer circuit 35, in contrast, the up/down signal is reduced to L thereby to reduce the amount of delay through the delay circuits 31 and 34. This process is repeated until the phase of the first internal clock CLK1 comes to coincide with the phase of the output of the buffer circuit 35. As described above, the delay amount in the delay circuit 31 and the buffer circuit 32 is identical to that in the delay circuit 34 and the buffer circuit 35. When they are in phase with each other, therefore, the output of the buffer 32 is 180° out of phase with the first internal clock CLK1.

The buffer 33 has the same configuration and the same delay amount as the buffer 32. The ½ phase shift φ½ produced by the buffer 33 is in phase with the output of the buffer 32. Specifically, the signal φ½ is 180° out of phase with the first internal clock CLK1.

Figure 8:
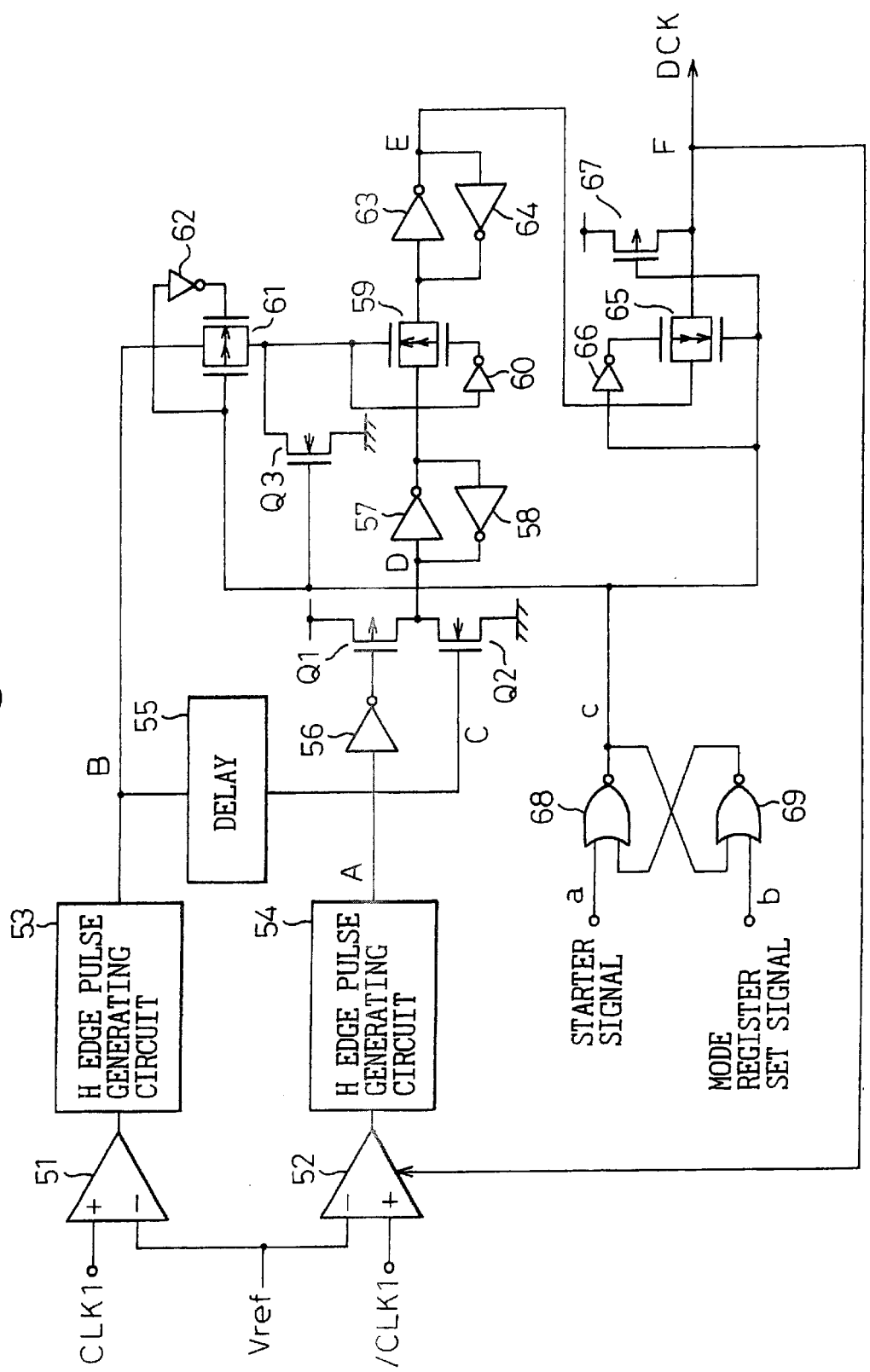
FIG. 8 is a diagram showing a configuration of a /CLK state detection circuit according to the first embodiment.
Figure 9:
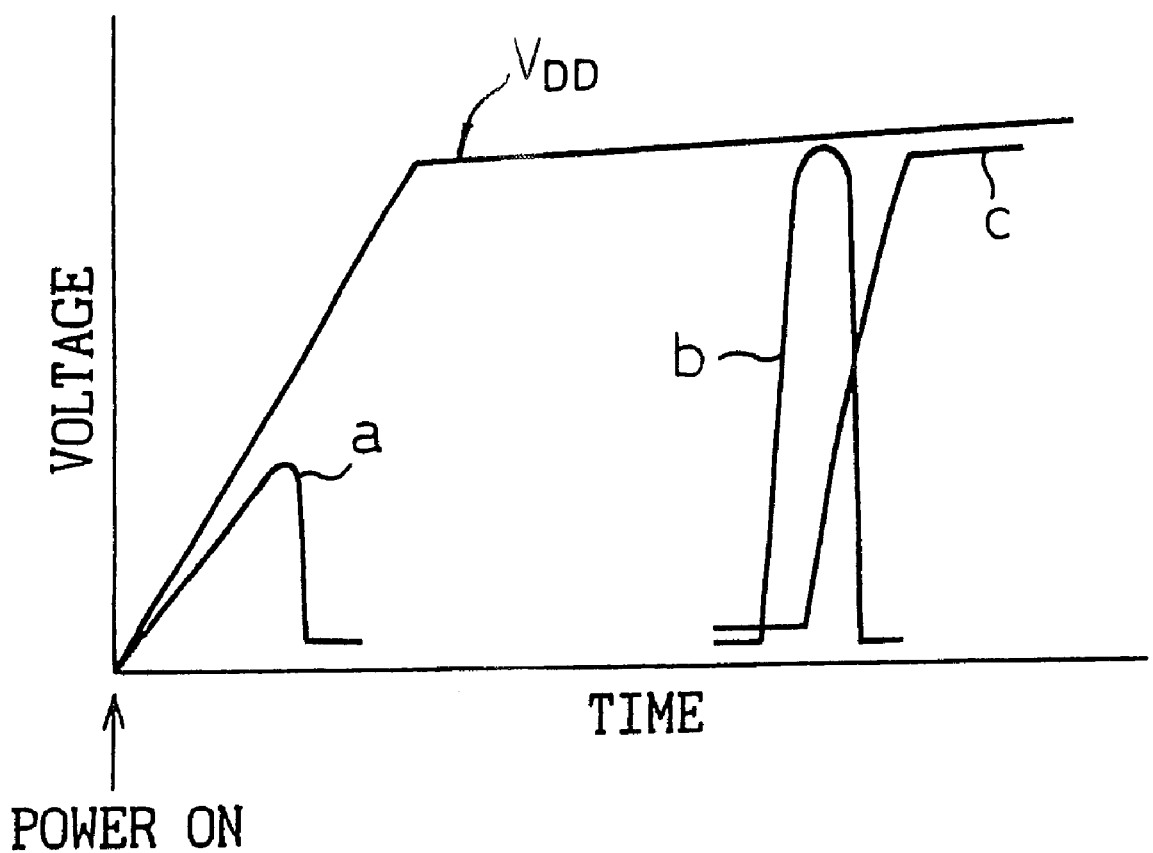
FIG. 9 is a diagram showing a control signal for the /CLK state detection circuit.
Figure 10:
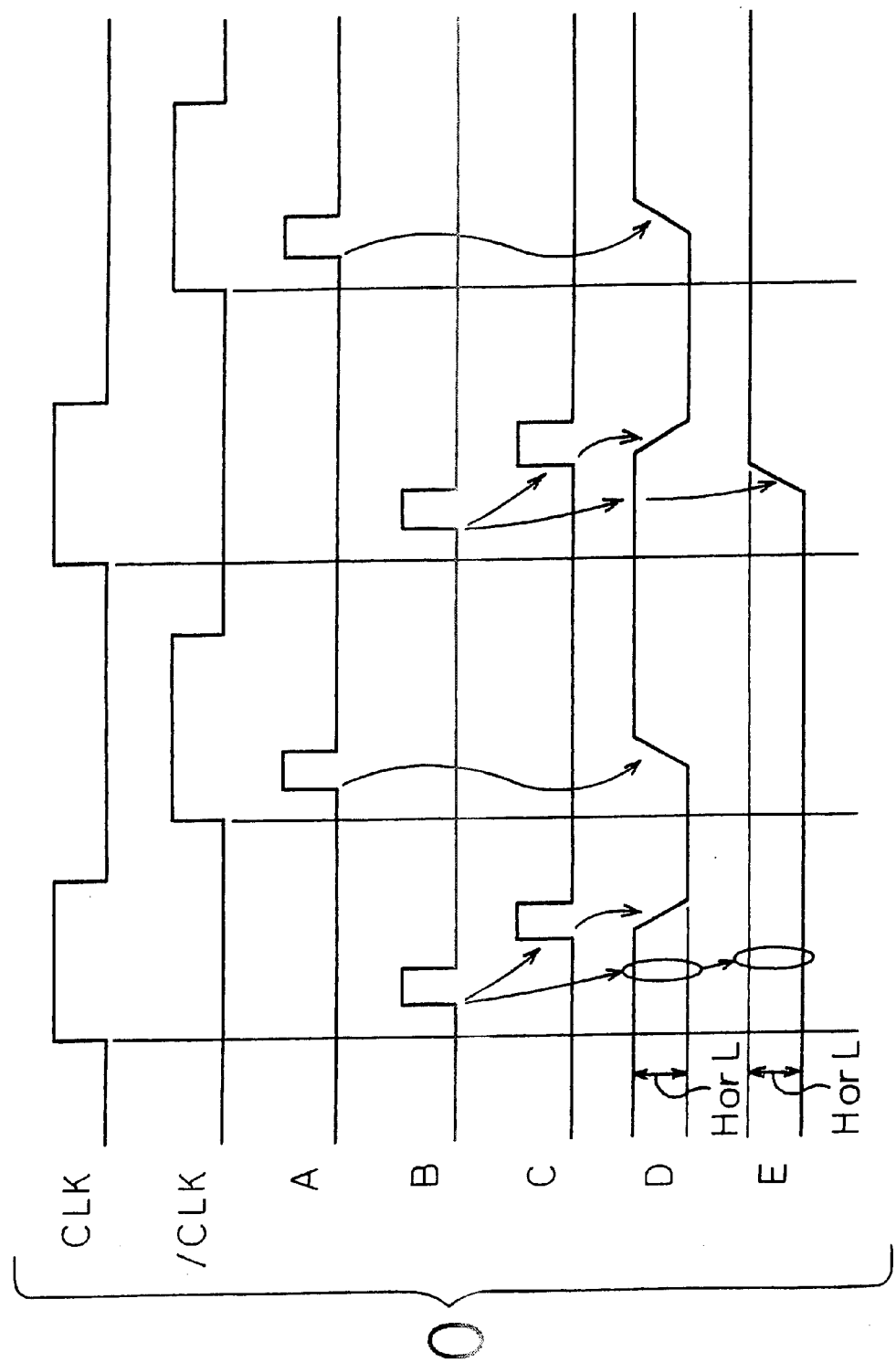
FIG. 10 is a time chart showing the operation of the /CLK state detection circuit according to the first embodiment.
Figure 11:
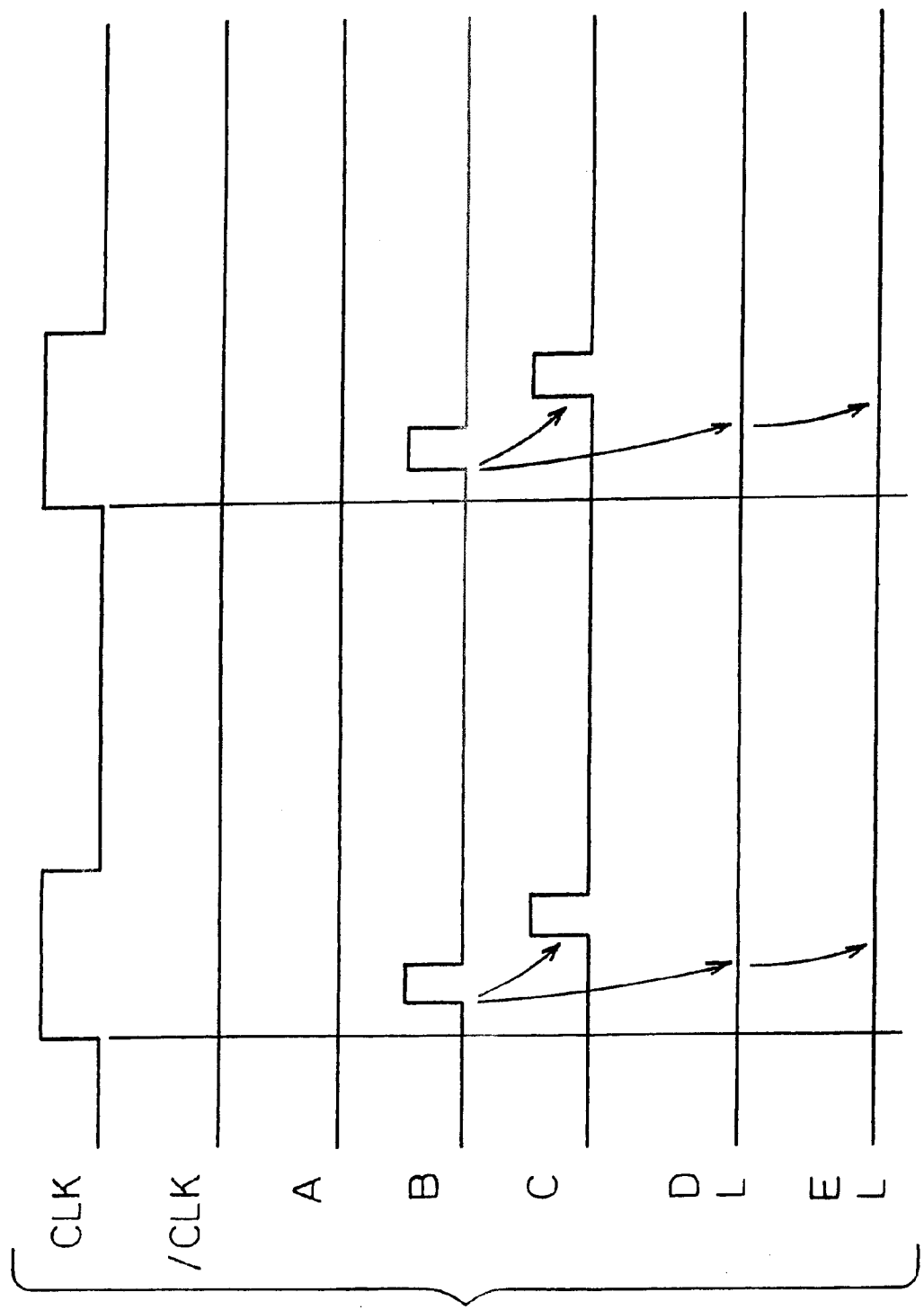
FIG. 11 is a time chart showing the operation of the /CLK state detection circuit according to the first embodiment.

FIG. 8 is a diagram showing a circuit configuration of a /CLK state detection circuit according to the first embodiment, FIG. 9 is a diagram showing control signals for the same circuit, FIG. 10 is a time chart showing the circuit operation with the second external clock /CLK applied thereto, and FIG. 11 is a time chart showing the circuit operation in the absence of the second external clock /CLK applied thereto As power is switched on, the NOR gates 68 and 69 are supplied with a starter signal a and a mode register set signal b as shown in FIG. 9. Accordingly, after the lapse of a predetermined time following the power on, a state latch signal c rises and closes a transfer gate 59. The logical value of the flip-flop configured of inverters 63 and 64 is held, while at the same time opening the transfer gate 65, thereby the logical value of the flip-flop configured of the inverters 63 and 64 is output. Also, with the rise of the state latch signal c, the buffer 52 is turned off, so that the state of the second external clock /CLK is detected before the rise of the state latch signal c and subsequently the detected result is held.

As shown in FIGS. 8 and 10, two buffers 51 and 52 are supplied with the first and second internal clocks CLK1 and /CLK1 output from the first and second clock input buffers 11 and 12, respectively. The outputs of the buffers 51 and 52 are applied to H edge pulse generating circuits 53 and 54, respectively. The H edge pulse generating circuit 53 generates a pulse in accordance with the leading edge of the first external clock. This pulse is applied to a transistor Q2 after being delayed in a delay line 55, reduces the input to the flip-flop made up of the inverters 57 and 58 to L, and stores the logical state thereof. When the second external clock is applied (active), the H edge pulse generating circuit 54 generates a pulse and turns on the transistor Q1. The input to the flip-flop configured of the inverters 57 and 58, therefore, rises to H, so that the logical state of the flip-flop undergoes a change. When the first external clock rises again and the H edge pulse generating circuit 53 generates a pulse, the transfer gate 59 is opened through the transfer gate 61. Accordingly, the logical state stored in the flip-flop including the inverters 57 and 58 is transferred to and stored in the flip-flop including the inverters 63 and 64. As described above, the pulse generated by the H edge pulse generating circuit 53 is delayed by the delay line 55 and then applied to the gate of the transistor Q2 thereby to turn on the transistor Q2. Thus the input to the flip-flop including the- inverters 57 and 58 changes the state to L. Since the transfer gate 59 is already closed, however, the logical state is not transferred to the next stage, but the flip-flop configured of the inverters 63 and 64 maintains the particular logical state. The same operation is repeated. As long as the second external clock is changed and a pulse is generated, therefore, the logical state of the flip-flop including the inverters 63 and 64 remains H. As described above, with the rise of the state latch signal signal c after the lapse of a predetermined time following switching on power, the prevailing state is stored and maintained. Once the second external signal is input, therefore, the judge signal DCK rises to H and maintains the same state.

In the case where the second external clock is not input (inactive), as shown in FIG. 11, the H edge pulse generating circuit 54 fails to generate a pulse. The input to the flip-flop including the inverters 57 and 58, therefore, remains L and the logical state also remains unchanged. Consequently, the logical state of the flip-flop including the inverters 63 and 64 remains L. This state is stored and maintained in accordance with the rise of the state latch signal c. The judge signal DCK, therefore, is reduced to L.

The /CLK state detection circuit 21 judges whether the second external clock is input or not in the manner described above. In the case where it is input, the switch 23 is operated in such a manner that the second clock CLK2 output from the second clock input buffer 12 is produced as the second internal clock /CLK1, while at the same time turning off the switch 24. In the case where the second external clock is not input, on the other hand, the switch 23 is operated in such a manner that the ½ phase shift φ½ output from the ½ phase shift DLL circuit 22 is produced as the second internal clock /CLK1, while at the same time closing the switch 24.

Figure 12:
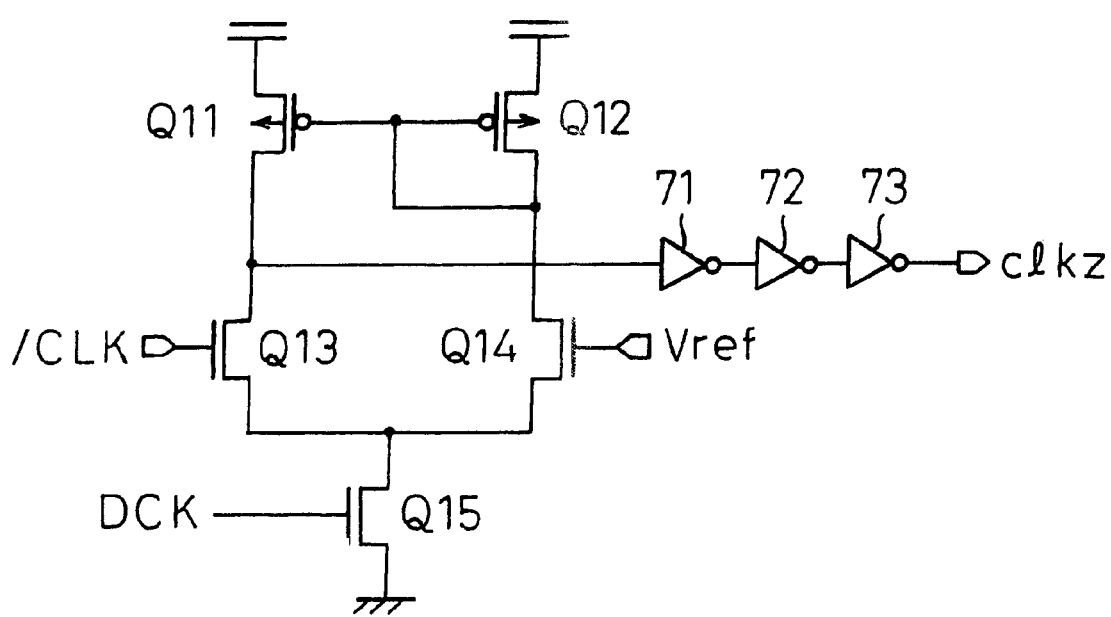
FIG. 12 is a diagram showing a configuration of an input circuit according to the first embodiment.

FIG. 12 is a diagram showing an example configuration of an input circuit constituting a second clock input buffer 12.

An input buffer is configured by adding to this input circuit an ESD circuit or the like for improving the breakdown voltage against static electricity. As shown in FIG. 12, this input circuit includes a current mirror circuit. This circuit is widely used and will not be described in detail. The gate of a transistor Q15 is supplied with a judge signal DCK. When this judge signal DCK is L, i.e., when the second external clock fails to be input, the input circuit is turned off. The current mirror circuit allows a current to flow therethrough regardless of whatever the input signal state is, and therefore consumes considerable power. When not used, therefore, the current mirror circuit is turned off to reduce power consumption.

Figure 13:
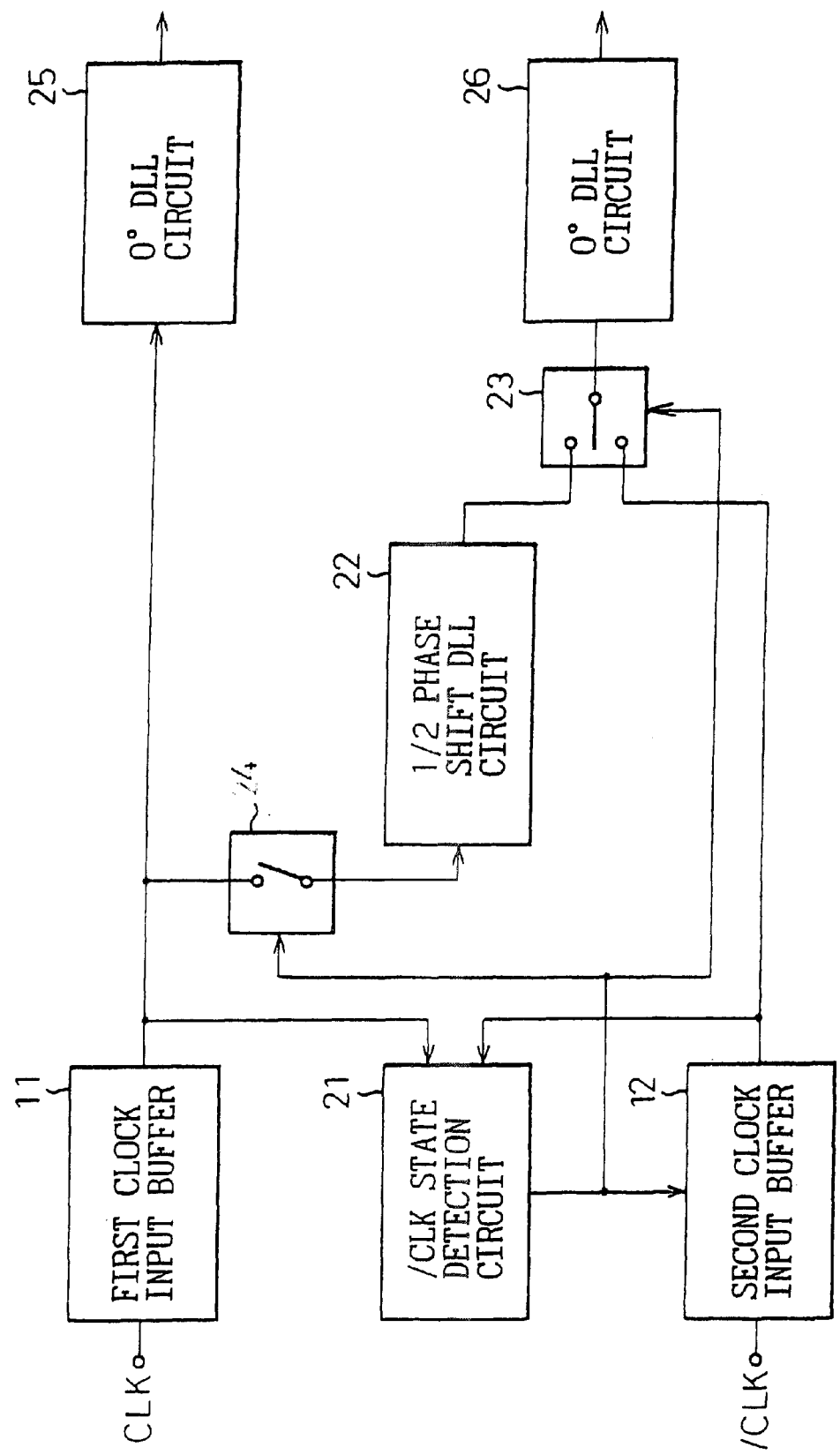
FIG. 13 is a diagram showing a configuration of an internal clock generating circuit of a SDRAM according to a second embodiment of the present invention.

FIG. 13 is a diagram showing a configuration of an internal clock generating circuit of a semiconductor device according to a second embodiment of the invention. As shown in FIG. 13, the second embodiment is different from the first embodiment in that 0° DLL circuits 25 and 26 are newly added. Further, the /CLK state detection circuit 21 is different from the /CLK state detection circuit in the first embodiment. Only these differences will be explained.

When an internal clock is generated from an external clock, a delay occurs through a clock input buffer and an internal clock generating circuit. A delay is also caused by a signal route from the clock input buffer to the internal clock generating circuit. In the case where the clock frequency is not very high, this delay poses substantially no problem. A very high clock frequency, however, is a great problem. In view of this, the internal clock generating circuit includes a DLL circuit or a PLL circuit to generate an internal clock in phase with the external clock. Specifically, a dummy circuit is provided for causing the same delay as in the clock input buffer and the internal clock generating circuit and causing the same delay as in the signal route from the clock input buffer to the internal clock generating circuit, using the DLL circuit as shown in FIGS. 6 and 7. The phase of the output of the delay circuit that has passed through this dummy circuit is compared with the phase of the internal clock, and both are controlled to coincide with each other. An internal clock having the same phase as the external clock thus is generated. This circuit will hereinafter be called a 0° DLL circuit, and can be realized also by a PLL circuit.

As shown in FIG. 13, according to the second embodiment, the 0° DLL circuit 25 adjusts the phase of the signal output from the first clock input buffer 11 and thus generates a first internal clock CLK1 exactly in phase with the first external clock CLK, and the 0° DLL circuit 26 adjusts the phase of the output signal of a switch 23. In this way, a second internal clock /CLK1 exactly in phase with the second external clock /CLK is generated.

Figure 14:
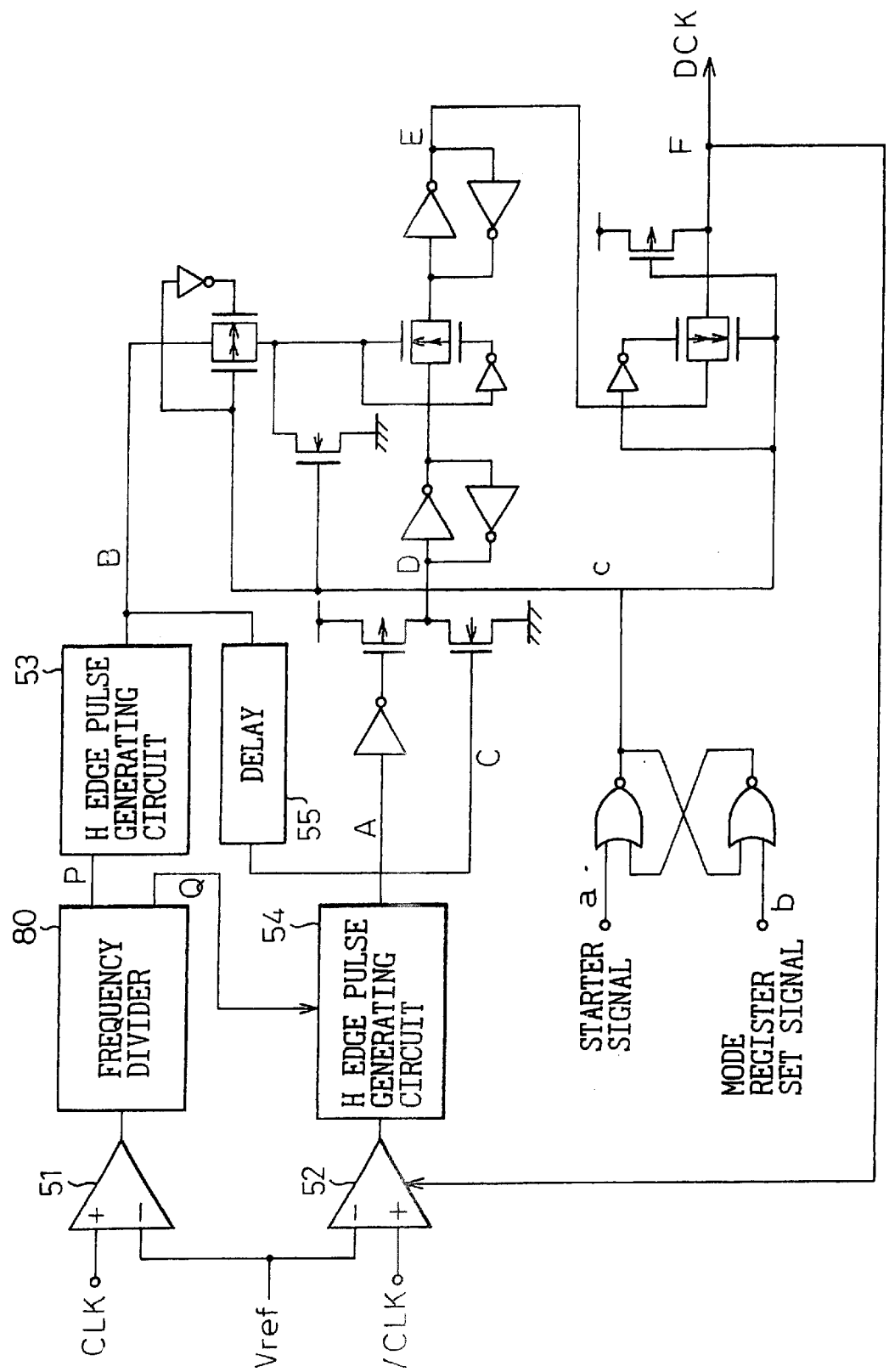
FIG. 14 is a diagram showing a configuration of a /CLK state detection circuit according to the second embodiment.
Figure 15:
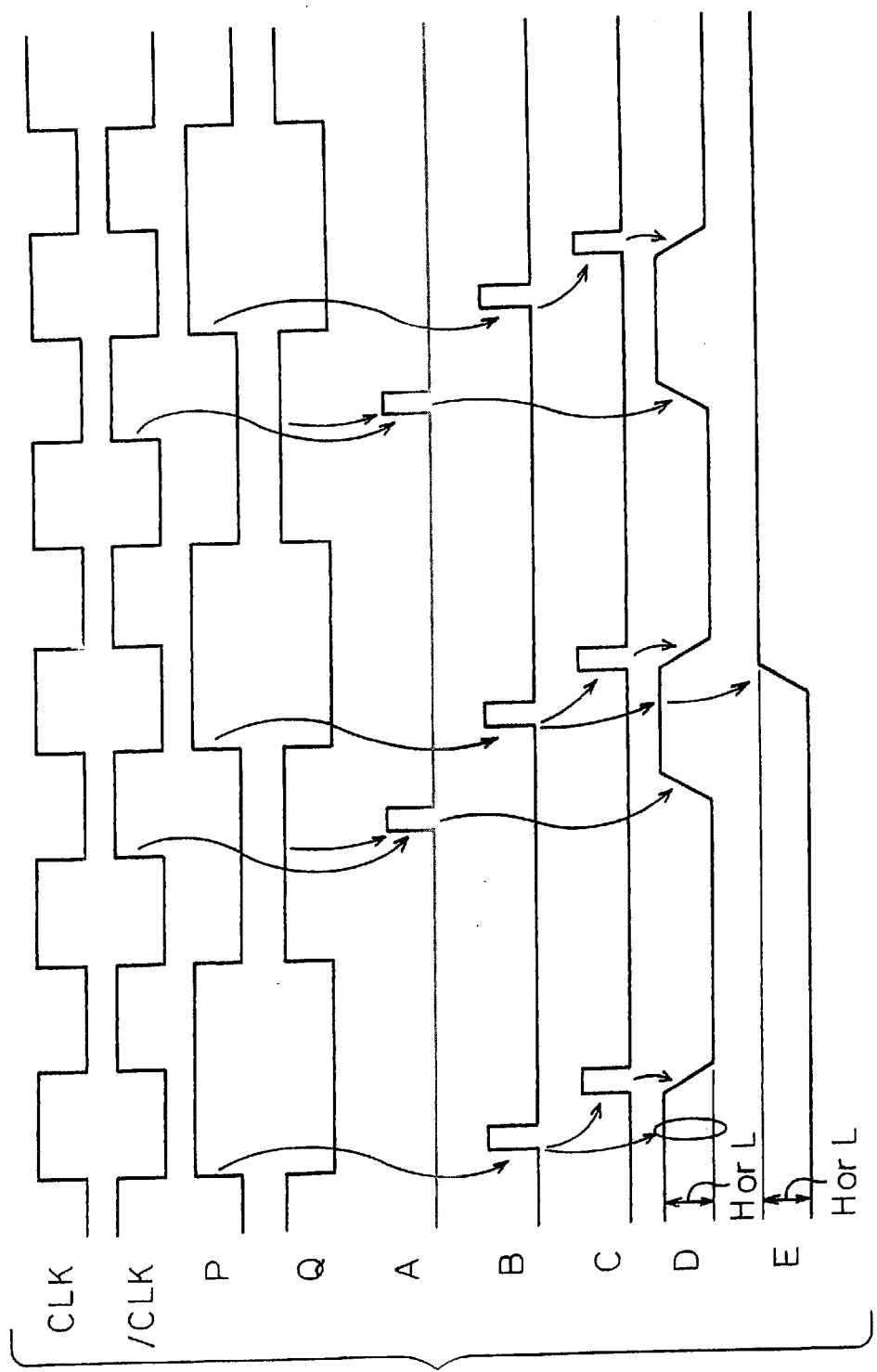
FIG. 15 is a time chart showing the operation of the /CLK state detection circuit according to the second embodiment.
Figure 16:
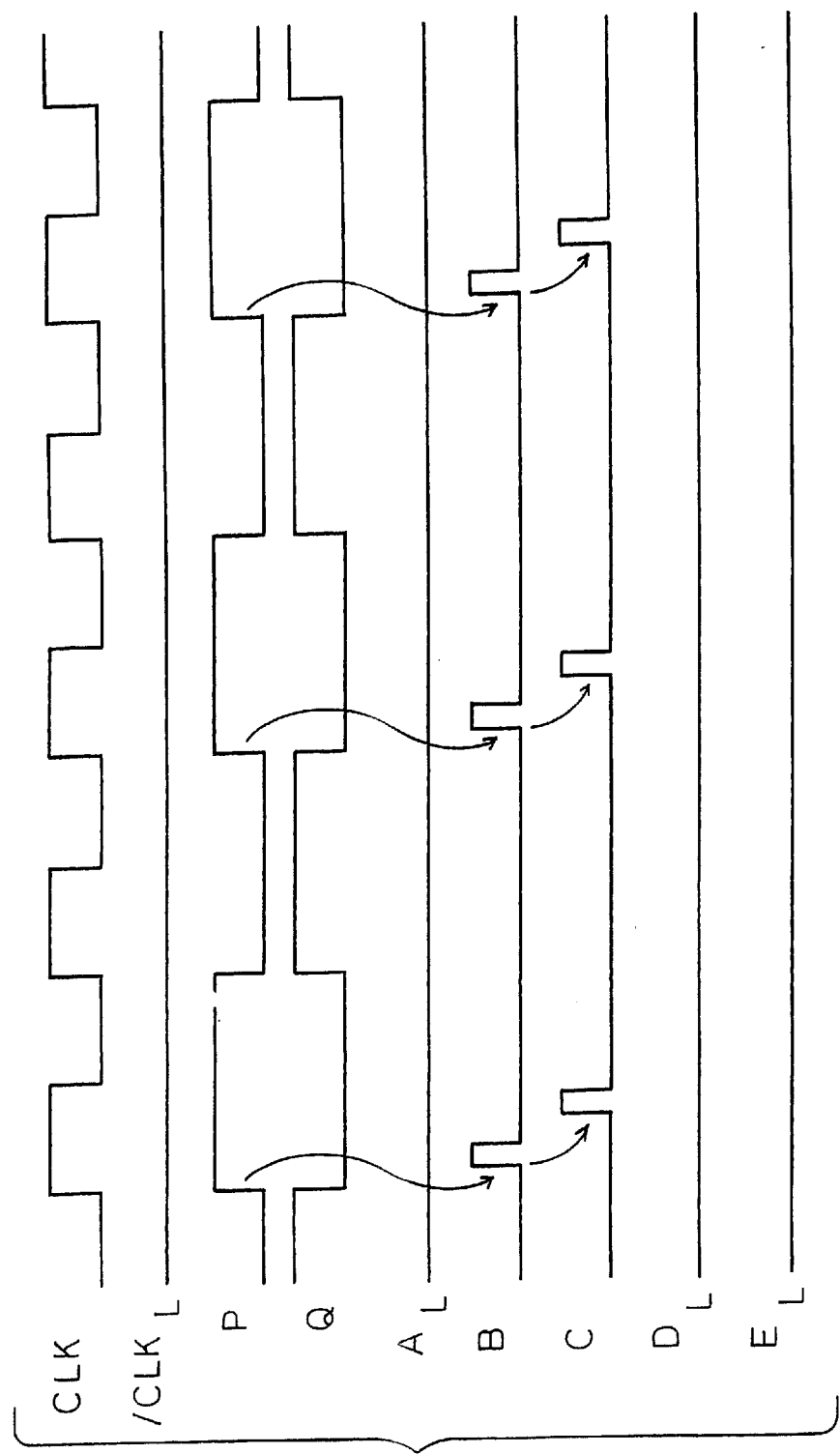
FIG. 16 is a time chart showing the operation of the /CLK state detection circuit according to the second embodiment.

FIG. 14 is a diagram showing a configuration of a /CLK state detection circuit according to the second embodiment. As shown in FIG. 14, this configuration is the same as that of the /CLK state detection circuit in the first embodiment of FIG. 7 except that a frequency divider 80 is added. FIGS. 15 and 16 are time charts showing the operation of the /CLK state detection circuit according to the second embodiment. Specifically, FIG. 15 represents the operation performed when the second external clock is input, whereas FIG. 16 refers to the operation in which the second external clock is input. An example of ½ frequency division is shown in the present case.

The frequency divider 80 divides the frequency of the output of the buffer 51 and produces signals P and Q complementary with each other. The period of the pulse generated in the H edge pulse generating circuit 53, therefore, is double that of the first embodiment. The H edge pulse generating circuit 54 is turned on only when the signal Q output from the frequency divider 80 is H. As a result, the period of the pulse generated in the H edge pulse generating circuit 54 is the same as in the first embodiment. After a pulse is generated in the H edge pulse generating circuit 54, a pulse is generated in the H edge pulse generating circuit 53 at the same timing as in the first embodiment. This pulse group thus performs the same operation as in the first embodiment. The same detection operation, therefore, is accomplished as in the first embodiment. Thus the signal for state detection is reduced in frequency, thereby making it possible to detect the state of /CLK easily.

Figure 17:
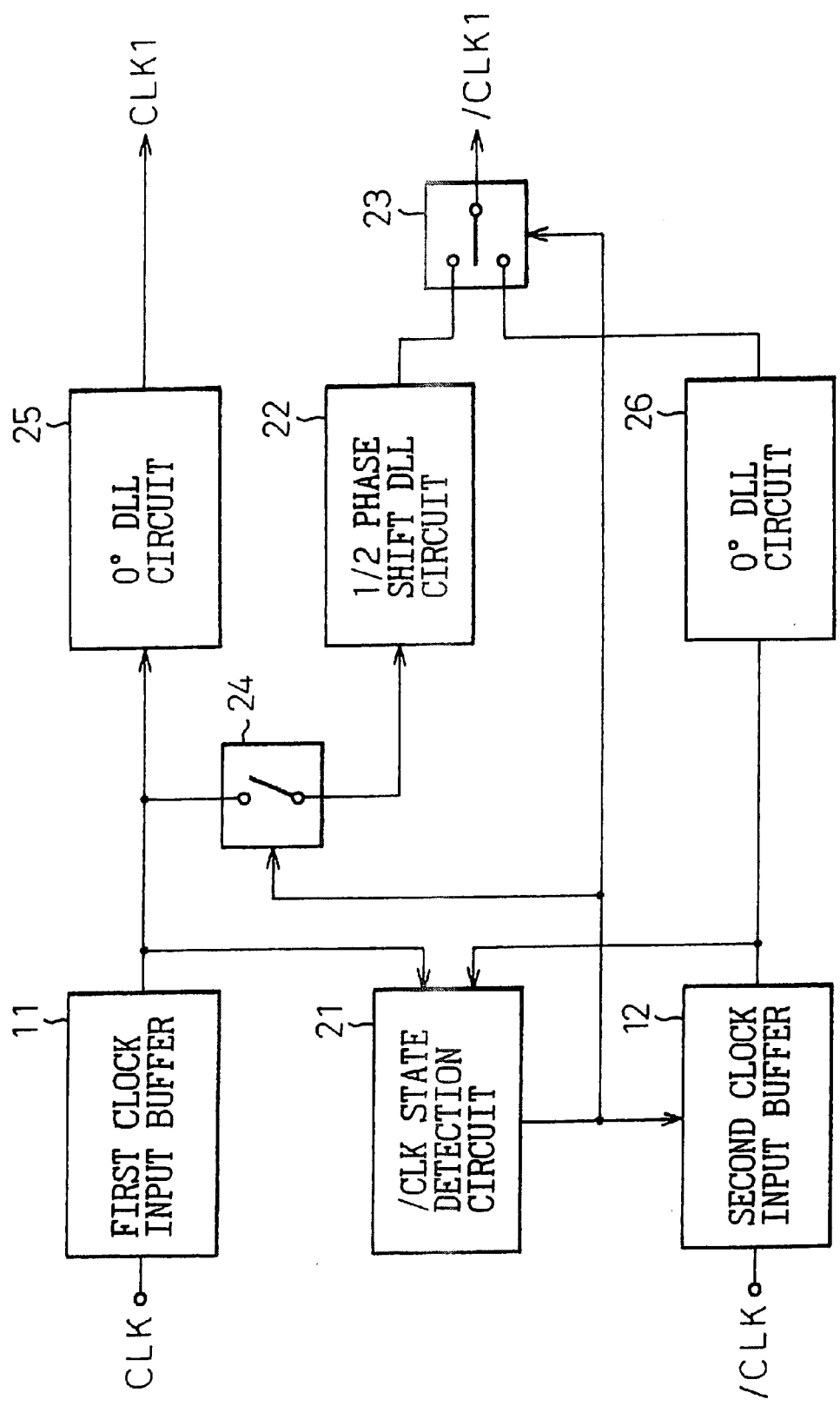
FIG. 17 is a diagram showing a configuration of an internal clock generating circuit of a SDRAM according to a third embodiment of the invention.

FIG. 17 is a diagram showing a configuration of an internal clock generating circuit of a semiconductor device according to a third embodiment of the invention. As shown in FIG. 17, according to the third embodiment, a 0° DLL circuit 26 is inserted after the second clock input buffer 12 unlike in the second embodiment. The other configuration is the same as in the second embodiment and will not be described.

Figure 18:
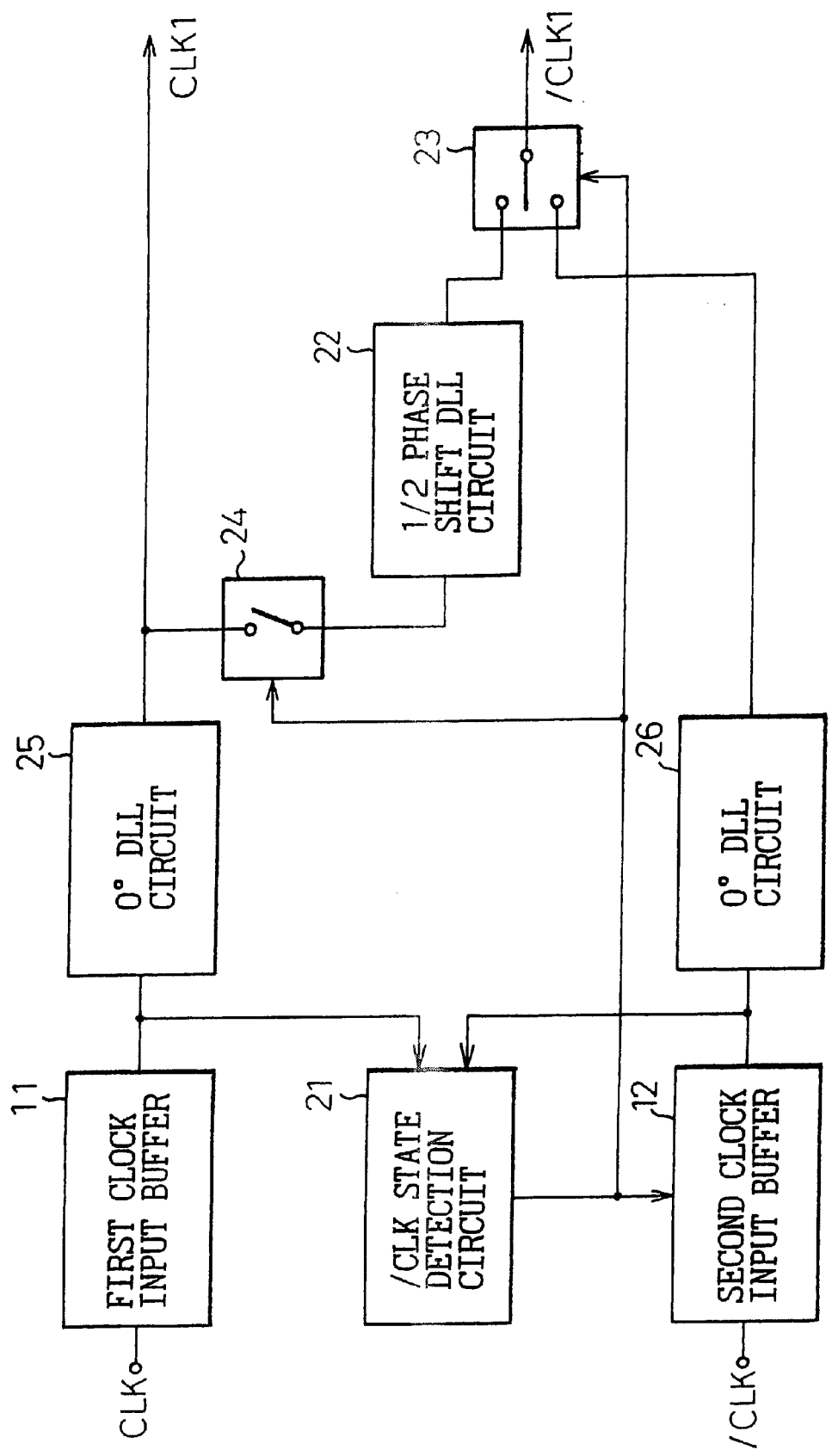
FIG. 18 is a diagram showing a configuration of an internal clock generating circuit of a SDRAM according to a fourth embodiment of the invention.

FIG. 18 is a diagram showing a configuration of an internal clock generating circuit of a semiconductor device according to a fourth embodiment. As shown in FIG. 18, the fourth embodiment is identical to the third embodiment except that an exactly phase-adjusted first internal clock output from the 0° DLL circuit 25 is applied through the switch 24 to the ½ phase shift DLL circuit 22, and therefore will not be described any further.

Figure 19:
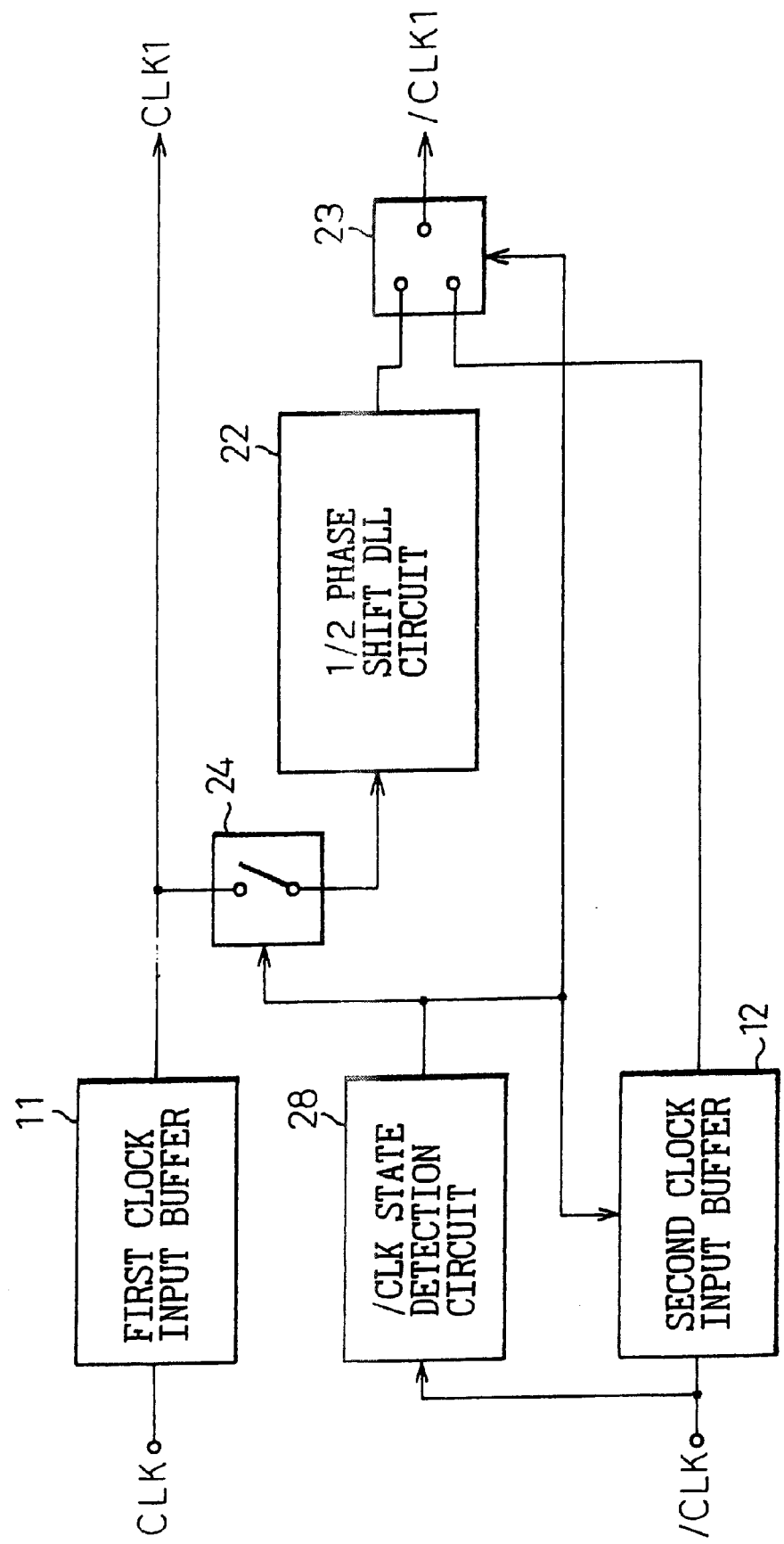
FIG. 19 is a diagram showing a configuration of an internal clock generating circuit of a SDRAM according to a fifth embodiment of the invention.

FIG. 19 is a diagram showing a configuration of an internal clock generating circuit of a semiconductor device according to a fifth embodiment of the invention. The fifth embodiment relates to a circuit for the SSTL standard providing an high-speed interface with a small-amplitude signal. In SSTL, the active signal has an amplitude which changes by ±0.2 V in both directions with respect to a reference voltage Vref. As shown in FIG. 19, the circuit according to the fifth embodiment, which has substantially the same configuration as that of the first embodiment, is different in the /CLK state detection circuit 28. The /CLK state detection circuit 28 detects the state of a second clock input pin supplied with a second external clock /CLK and judges whether the second external clock is input or not.

Figure 20:
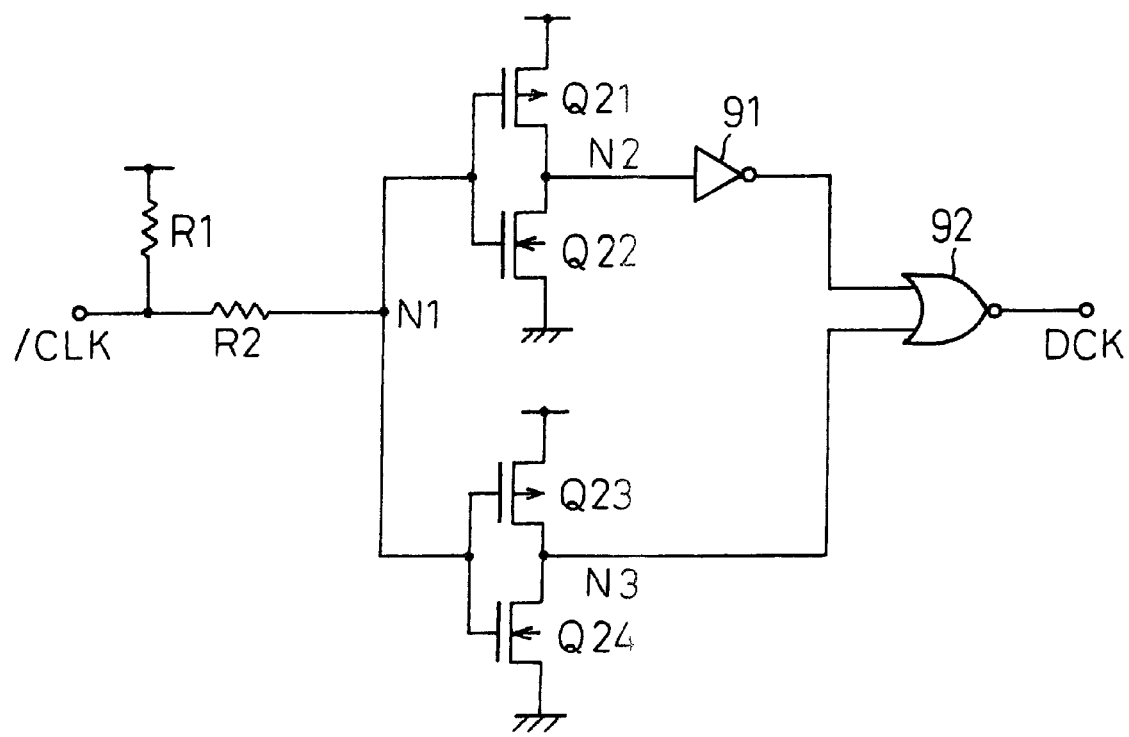
FIG. 20 is a diagram showing a configuration of a /CLK state detection circuit according to the fifth embodiment.

FIG. 20 is a diagram showing a configuration of a /CLK state detection circuit 28 according to the fifth embodiment. As shown in FIG. 20, a resistor R1 is inserted between a second clock input pin and a high-voltage power terminal Vcc. A P-channel transistor Q21 and a N-channel transistor Q22 are inserted in series between the high-voltage power terminal Vcc and the low-voltage power terminal Vss, thereby constituting a first inverter. Also, a P-channel transistor Q23 and a N-channel transistor Q24 are connected in series between the high-voltage power terminal Vcc and the low-voltage power terminal Vss to constitute a second inverter. The gate of each transistor is connected to the second clock input pin through a resistor R2. The output of the first inverter is inverted by the inverter 91 and applied to a NOR gate 92, while the output of the second inverter is directly applied to the NOR gate 92.

The size (gate width) of the P-channel transistor Q21 making up the first inverter is sufficiently large as compared with that of the N-channel transistor Q22. Also, the size of the N-channel transistor Q24 making up the second inverter is sufficiently larger than that of the P-channel transistor Q23. Upon application of the second external clock to the second clock input pin, a node N1 assumes an intermediate level. Then, the output of the first inverter (node N2) assumes a H state in view of the fact that the size of the P-channel transistor Q21 is sufficiently larger than the size of the N-channel transistor Q22. In similar fashion, since the size of the N-channel transistor Q24 is sufficiently larger than the size of the P-channel transistor Q23, the output of the second inverter (node N3) assumes a L state. The judge signal DCK thus assumes a H state.

When the potential of the second clock input pin is Vcc, the node N1 also assumes Vcc. Both the nodes N2 and N3 are reduced to L, and the judge signal DCK assumes an L state. When the second clock input pin assumes a potential Vss, on the other hand, the node N1 also assumes Vss, so that both the nodes N2 and N3 assume a H state, with the judge signal DCK assuming a L state. Further, when the second clock input pin is open, the node N1 assumes Vcc and therefore the judge signal DCK is L. In this way, the judge signal DCK assumes a H state when the second external clock is input, and a L state otherwise.

According to the first to fifth embodiments described above, the system of DDR scheme is one of two types. One concerns the case in which only the first external clock CLK is input, and the other concerns the case in which both the first external clock CLK and the second external clock /CLK are input. Both of the cases can be detected and the requirement for a particular case can be met automatically, in which the first and second internal clocks generated are used independently of each other, as described above with reference to an example. Nevertheless, some data output circuits are required to operate in accordance with both the first and second internal clocks. The embodiment described below refers to an example of DDR scheme using a data output circuit, which is supplied with both the first and second external clocks CLK, /CLK and which operates in accordance with both the first and second internal clocks.

Figure 21:
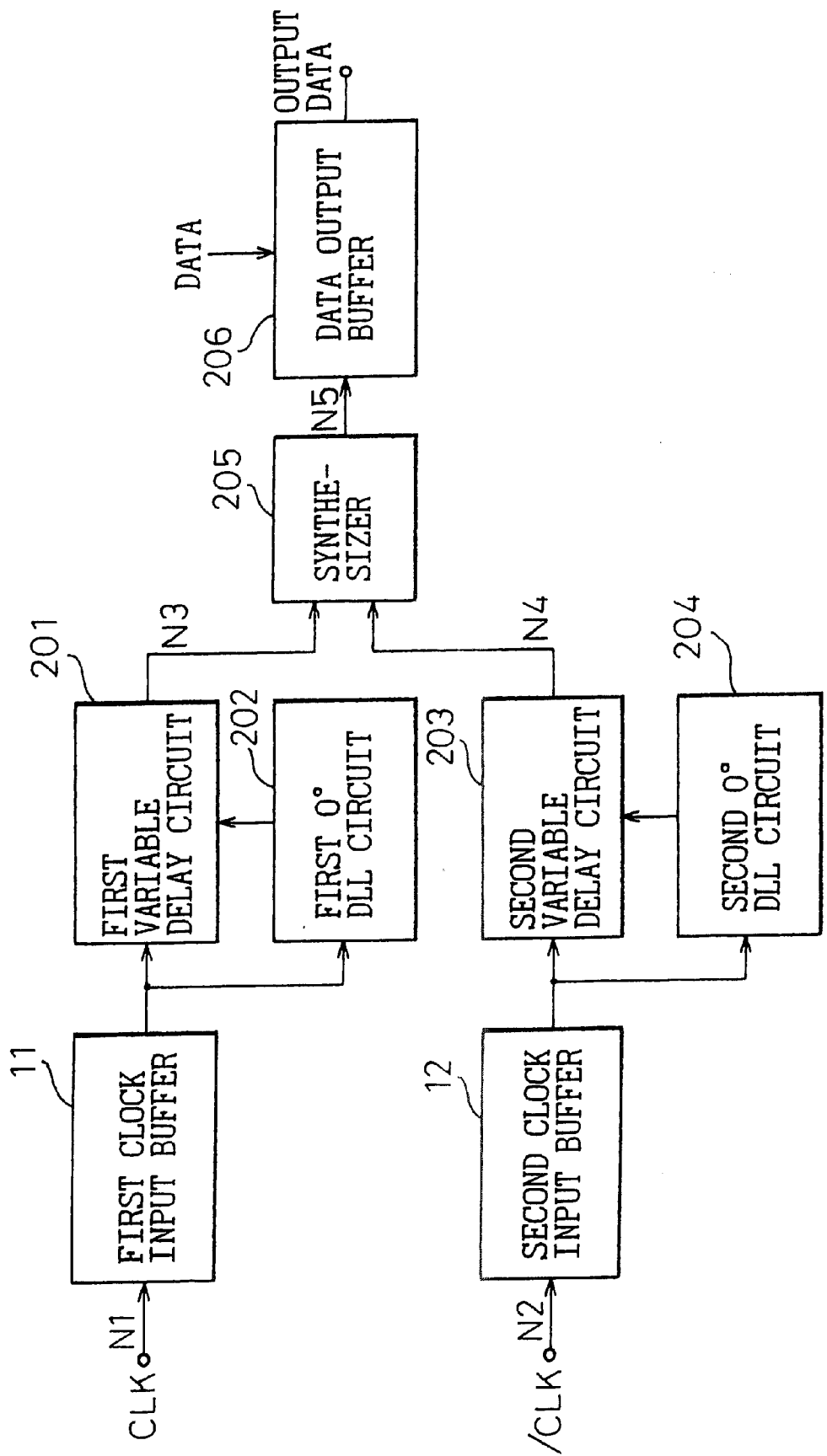
FIG. 21 is a diagram showing a configuration of an output clock generating circuit according to a sixth embodiment.
Figure 22:
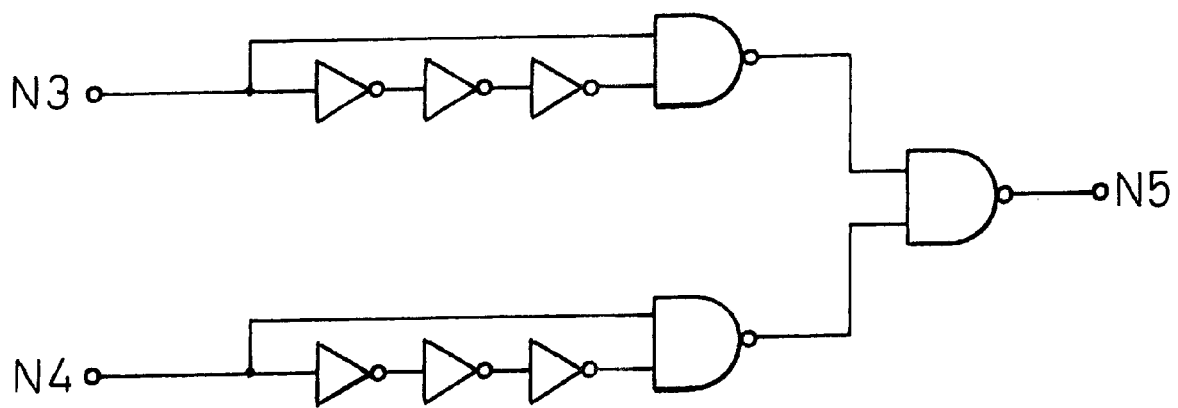
FIG. 22 is a diagram showing a circuit configuration of a synthesizer used with an output clock generating circuit according to the sixth embodiment.

FIG. 21 is a diagram showing a configuration of an output clock generating circuit according to a sixth embodiment. FIG. 22 is a diagram showing a circuit configuration of a synthesizer, and FIG. 23 is a time chart showing the operation of the sixth embodiment.

As shown in FIG. 21, an output clock generating circuit according to the sixth embodiment includes a first clock buffer 11 supplied with a first external clock CLK (N1), and a second clock buffer 12 supplied with a second external clock /CLK (N2). This is similar to the first embodiment. The first internal clock CLK and the second internal clock /CLK are supplied to each part of the semiconductor device from this output clock generating circuit. The data output buffer 206 according to the sixth embodiment is for outputting data in accordance with a leading edge of the internal clock supplied thereto. This buffer outputs data according to DDR scheme from a single circuit. As shown in FIG. 22, therefore, a clock N5 having a frequency twice as high as the first external clock CLK and the second external clock /CLK is required to be supplied. For generating the clock N5 twice as high in frequency, a synthesizer 205 shown in FIG. 22 is used for generating the clock N5 from the first and second internal clocks N3, N4. The process up to this point is similar to the corresponding process in the prior art.

Figure 23:
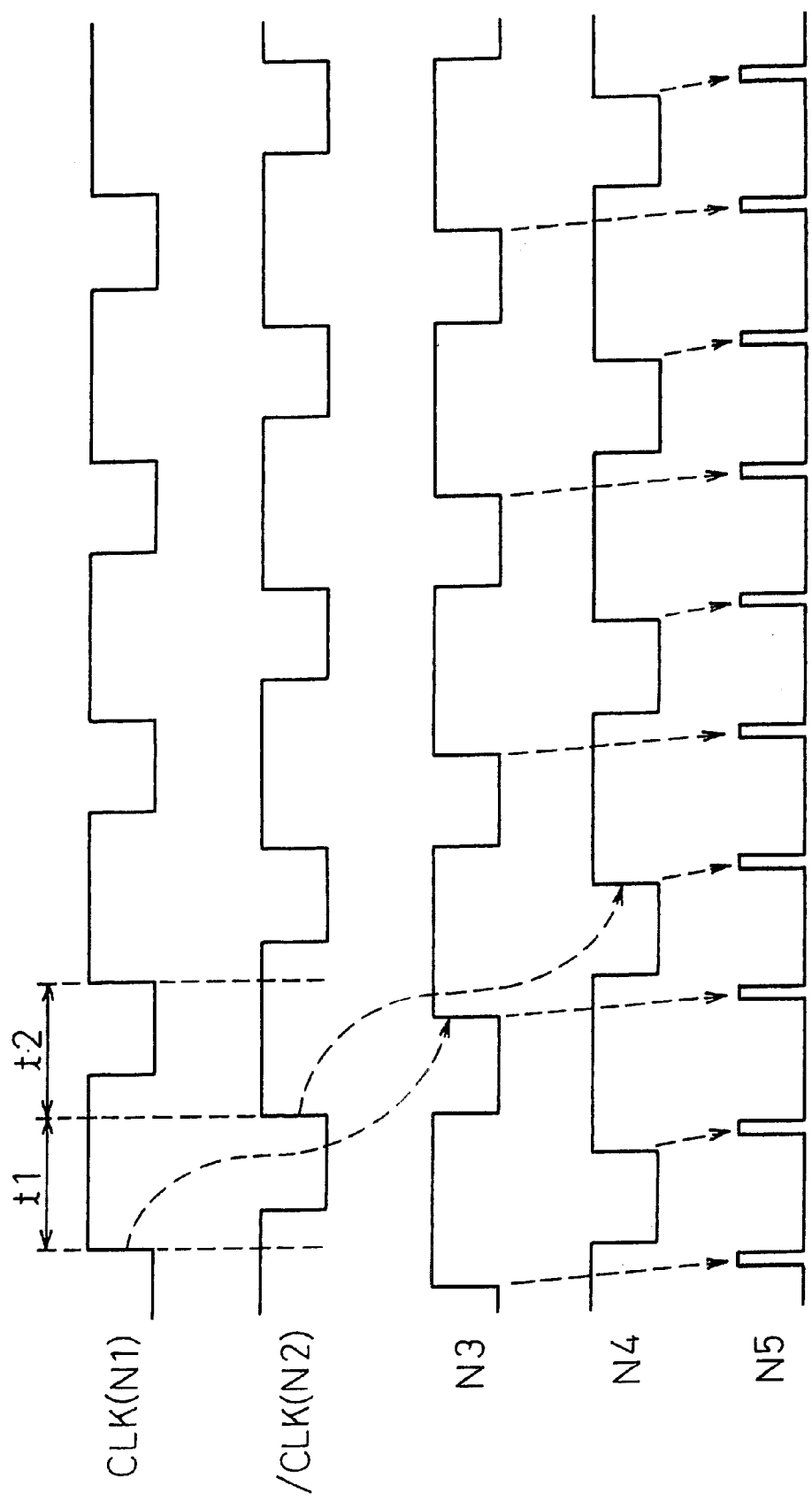
FIG. 23 is a time chart showing the operation of the output clock generating circuit according to the sixth embodiment.

As shown in FIG. 23, the data output buffer 206 is required to change the output data in a predetermined phase relationship (0° in this case) with the leading edge of the first and second external clocks CLK, /CLK, respectively. For this to be realized, the leading edge of the clock N5 supplied to the data output buffer 206 is required to occur slightly (by an amount equivalent to the delay in the data output buffer 206) earlier than the leading edge of the first and second external clocks CLK, /CLK. If the first and second internal clocks output from the first and second clock buffers 11, 12 are applied directly to the synthesizer 205, however, the clock N5 output from the synthesizer 205 may fail to meet the above-mentioned conditions. In view of this, the semiconductor device according to the sixth embodiment further comprises a first 0° phase adjusting circuit including a first variable delay circuit 201 for delaying the first clock output from the first clock buffer 11 in variable way and a first 0° (360°) DLL circuit 202 for controlling the delay amount of the first variable delay circuit 201 in such a manner that the clock N5 meets the above-mentioned conditions, and a second 0° phase adjusting circuit including a second variable delay circuit 203 having a variable delay amount for delaying the second clock output from the second clock buffer 12 and a second 0° (360°) DLL circuit 204 for controlling the delay amount of the second variable delay circuit 203 in such a manner that the clock N5 meets the above-mentioned conditions.

The first and second 0° DLL circuits 202, 204 compare the phase of the data actually output from the data output buffer 206 with the phase of the first and second external clocks CLK, /CLK, and judges whether the phase of the output data is ahead of or lagging behind the phase of the clocks CLK, /CLK. On the basis of this judgment, the delay amount of the first and second variable delay circuits 201, 203 can be controlled. According to the sixth embodiment, however, taking the layout limitation into consideration, the first and second 0° DLL circuits 202, 204 include a dummy route equivalent to the signal route leading from the first and second clock input buffers 11, 12 to the data output buffer 206 for detecting the phase state using the signal in the dummy route. The first and second 0° phase adjusting circuits have the same configuration. The description that follows, therefore, will be made about only the first 0° phase adjusting circuit.

Figure 24:
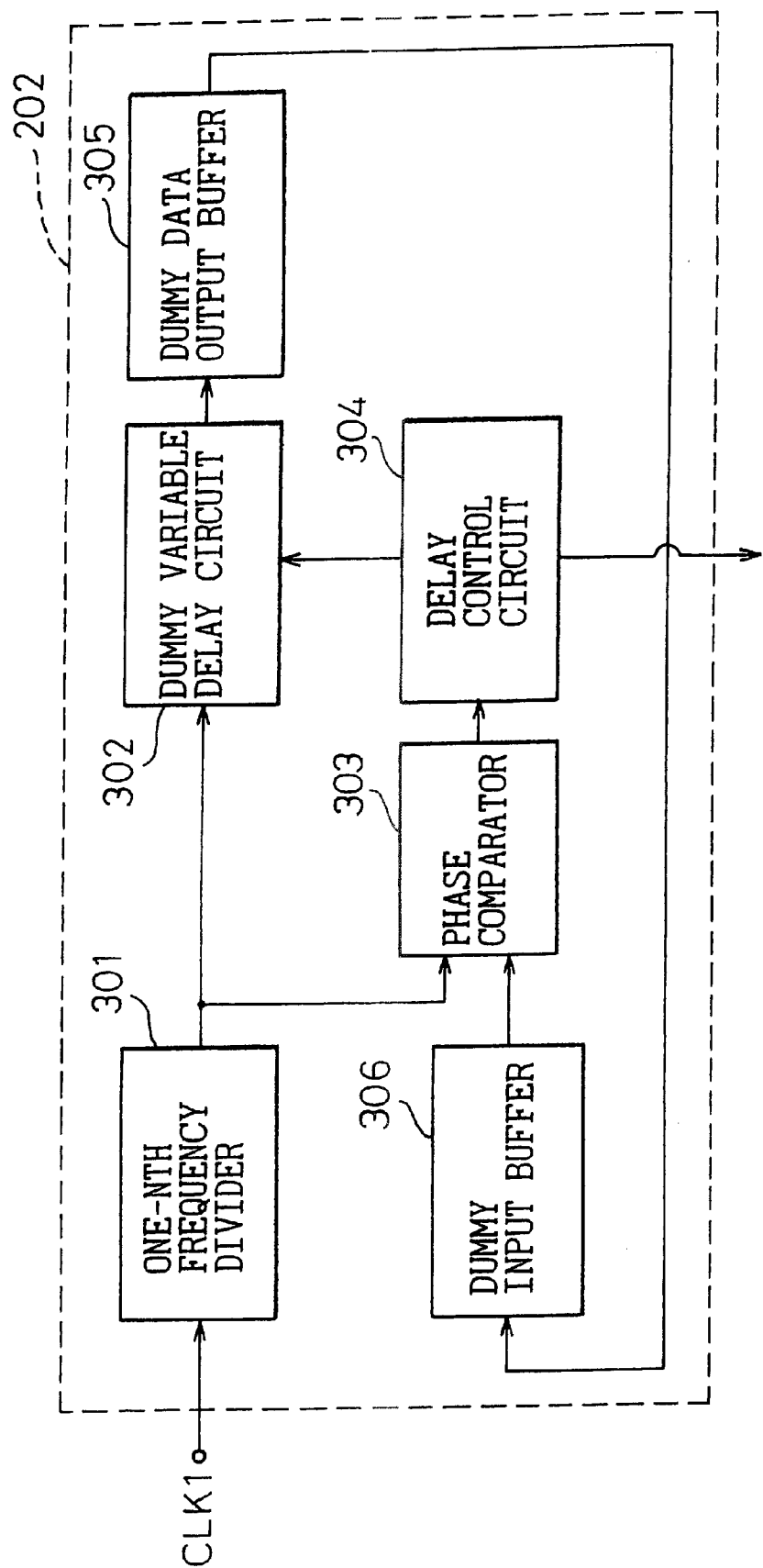
FIG. 24 is a diagram showing a configuration of 0° (360°) DLL circuit according to the sixth embodiment.

FIG. 24 is a diagram showing a configuration of a 0° (360°) phase DLL circuit according to the sixth embodiment. As shown in FIG. 24, the first 0° DLL circuit 202 includes a 1/N frequency divider 301 for dividing the frequency of the internal clock CLK1 output from the first clock input buffer 11 by a factor of N, a dummy variable delay circuit 302 for delaying the output of the 1/N frequency divider 301 by an amount indicated from the delay control circuit 304, a dummy data output buffer 305 for delaying the output of the dummy variable delay circuit 302, a dummy input buffer 306 for delaying the output of the dummy data output buffer 305 further, a phase comparator 303 for comparing the phase of the output of the 1/N frequency divider 301 with the phase of the output of the dummy input buffer 306, and a delay control circuit 304 for controlling the delay amount of the dummy delay circuit 302 and the first variable delay circuit 201 based on the result of comparison in the phase comparator 303.

The 1/N frequency divider 301 is for reducing the operating frequency in the first 0° DLL circuit 202 for reducing the power consumption. The first and second external clocks CLK, /CLK never undergo an abrupt change. Under steady state, therefore, frequent feedback control is not required in the first 0° DLL circuit 202. Once power is switched on and the semiconductor device starts to operate, the initializing operation is performed until the DLL circuit is stabilized to such an extent that the internal clock is in phase with the external clock. Provision of the 1/N frequency divider 301, however, undesirably lengthens the initialization time correspondingly. Taking these facts into account, the dividing ratio of the 1/N frequency divider 301 is set in a range allowing for the time required for initialization, thus saving the power consumption.

The dummy variable delay circuit 302, as described later, is capable of changing the delay amount in accordance with the control signal supplied from the delay control circuit 304, and has the same configuration as the first variable delay circuit 201. The dummy data output buffer 305 is for causing the same delay as the signal route from the first variable delay circuit 201 through the synthesizer 205 to the data output buffer 206. The dummy input buffer 306, on the other hand, is for causing the same delay as in the signal route from the first clock input buffer 11 to the first variable delay circuit 201. The signal route from the first clock input buffer 11 to the data output buffer 206 through the first variable delay circuit 201 and the synthesizer 205 is equivalent to the signal route from the dummy variable delay circuit 302 through the dummy data output buffer 305 to the dummy input buffer 306. Both routes are fabricated in such a manner that the signals passing through them are delayed by the same amount by temperature changes.

The phase comparator 303 compares the output phase of the 1/N frequency divider 301 with the output phase of the dummy input buffer 306 and outputs the judgment as to which output is ahead of the other to the delay control circuit 304. Based on this comparison, the delay control circuit 304 outputs a control signal for increasing or decreasing the delay amount of the dummy variable delay circuit 302 in such a manner that the outputs from the two circuits are in phase with each other. When the outputs are in phase with each other, the delay amount of the signal route from the dummy variable delay circuit 302 through the dummy data output buffer 305 to the dummy input buffer 306 is an integral multiple of (normally, equal to) one clock period, so that the output of the 1/N frequency divider 301 is 360° out of phase with the output of the dummy input buffer 306.

As described above, the first variable delay circuit 201 has the same configuration as the dummy variable delay circuit 302, and is controlled by the same control signal supplied from the delay control circuit 304. Therefore, the first variable delay circuit 201 has the same delay amount as the dummy variable delay circuit 302. Also, the signal route from the first clock input buffer 11 to the data output buffer 206 through the first variable delay circuit 201 and the synthesizer 205 is equivalent to the signal route from the dummy variable delay circuit 302 to the dummy input buffer 306 through the dummy data output buffer 305. Therefore, the delay amount of the signal route from the first clock input buffer 11 to the data output buffer 206 through the first variable delay circuit 201 and the synthesizer 205 is equal to one clock period. In similar fashion, the delay amount of the signal route from the second clock input buffer 12 to the data output buffer 206 through the second variable delay circuit 203 and the synthesizer 205 is equal to one clock period. Consequently, the data output from the data output buffer 206 changes in synchronism with the first external clock CLK and the second external clock /CLK alternately.

Figure 25A:
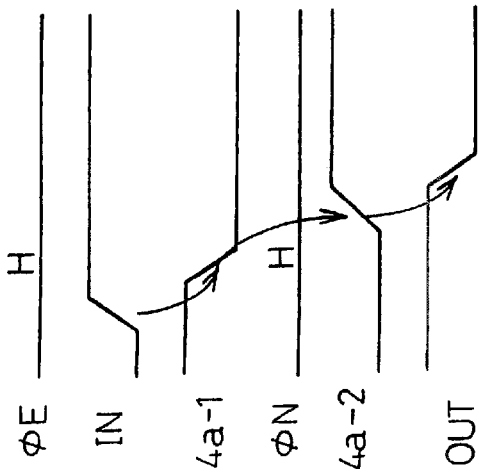
FIGS. 25A to 25C are diagrams showing the configuration and operation of a variable delay circuit according to the sixth embodiment.
Figure 25B:
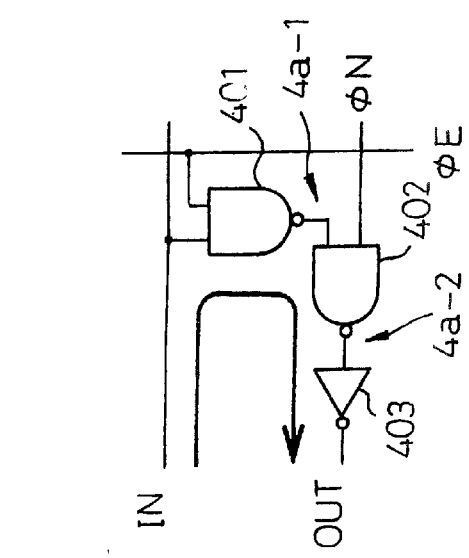
Figure 25C:
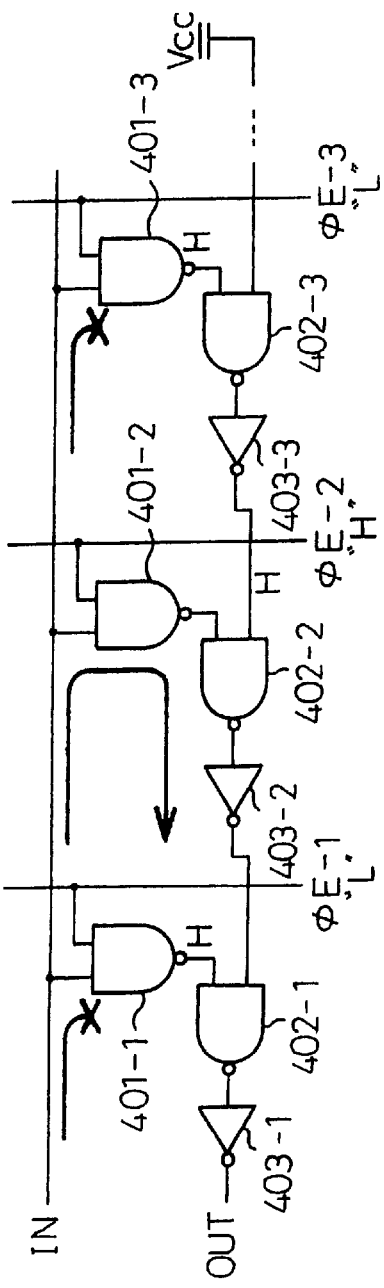

Next, the dummy variable delay circuit 302, the phase comparison circuit 303 and the delay control circuit 304 of the sixth embodiments will be described. FIGS. 25A to 25C are diagrams showing the circuitry of the first variable delay circuit 201 and dummy variable delay circuit 302, and the waveforms of operating waves. FIG. 25A shows the circuitry of a delay circuit for handling one bit, FIG. 25C shows the circuitry in which the delay circuit for handling one bit is connected on a plurality of stages, and explains the operations of the connected delay circuits, and FIG. 25B is a timing chart showing the operations of the delay circuit for handling one bit.

As shown in FIG. 25A, a delay circuit for handling one bit is composed of two NAND circuits 401 and 402, and an inverter 403. The operations of the delay circuit for handling one bit will be described in conjunction with FIG. 25B. An input $\phi E$ is an activation signal. When the input $\phi E$ goes high, the delay circuit operates. In FIG. 25B, the input $\phi E$ is high, and reception is enabled. A signal IN is an input signal to be supplied to the delay circuit for handling one bit. A signal $\phi N$ is a signal supplied from a right-hand delay circuit out of the plurality of stages of delay circuits. A signal OUT is an output signal sent from the delay circuit for handling one bit. Waves 4a-1 and 4a-2 are waves developing at associated internal terminals in the circuitry shown in FIG. 25A. The output signal OUT serves as a signal ON to be supplied to a left-hand delay circuit.

When the signal $\phi N$ is low, the signal OUT remains low. When the signal $\phi N$ is high and the signal $\phi E$ is low, the signal OUT is high. When the signal $\phi N$ is high and the signal $\phi E$ is high, if the input signal IN is low, the signal OUT goes high. If the signal IN is high, the signal OUT goes low. In FIG. 25B, the signal $\phi E$ is high and the signal $\phi N$ is high. When the signal IN rises or makes a low-to-high transition, the input signal IN is reversed while passing through the NAND gates 401 and 402 and the inverter 403. Consequently, the output OUT is provided.

FIG. 25C shows an example in which a plurality of stages of delay circuits each handling one bit, each of which has the circuitry shown in FIG. 25A, are cascaded to constitute an actual delay circuit. Only three stages are shown. However, in practice, a plurality of stages of delay circuits are cascaded. A signal line over which the activation signal $\phi E$ is transmitted is provided for each circuit element. That is to say, there are a plurality of signal lines $\phi E$-1, $\phi E$-2, $\phi E$-3. The signals are controlled by the delay control circuit 304.

In FIG. 25C, a delay circuit for handling one bit located in the center is activated, and the signal $\phi E$-2 is driven high. In this case, when the input signal IN makes a low-to-high transition, since the signals $\phi E$-1 and $\phi E$-3 applied to the left-hand delay circuit for handling one bit and to the right-hand delay circuit for handling one bit are low, the input signal IN is cut off by NAND circuits 401-1 and 401-3 respectively. The signal $\phi E$-2 applied to the activated center delay circuit for handling one bit is high. The input signal IN therefore passes through a NAND circuit 401-2. Since an output OUT of the right-hand delay circuit for handling one bit is high, the input signal IN passes through a NAND circuit 402-2 and is transmitted as a low-level signal to an output terminal OUT. As mentioned above, when the output OUT of the right-hand delay circuit, that is, the signal $\phi N$ is low, the output OUT of the center delay circuit is always low. The low-level signal is transmitted to the NAND circuit and inverter of the left-hand delay circuit for handling one bit, and fetched as a final signal OUT.

The input signal IN is thus transmitted via an activated delay circuit for handling one bit while being routed along a folded path, and finally fetched as a signal OUT. Depending on the activation signal $\phi E$ for a delay circuit which is driven high, the magnitude of a delay can be controlled. The magnitude of a delay to be produced by a delay circuit for handling one bit is determined with a total signal propagation time required for a signal to propagate the NAND circuits and inverter. The time is regarded as a unit delay time of the DLL. A total delay time is calculated by multiplying the magnitude of a delay to be produced by a delay circuit for handling one bit by the number of stages through which a signal is passed.

Figure 26:
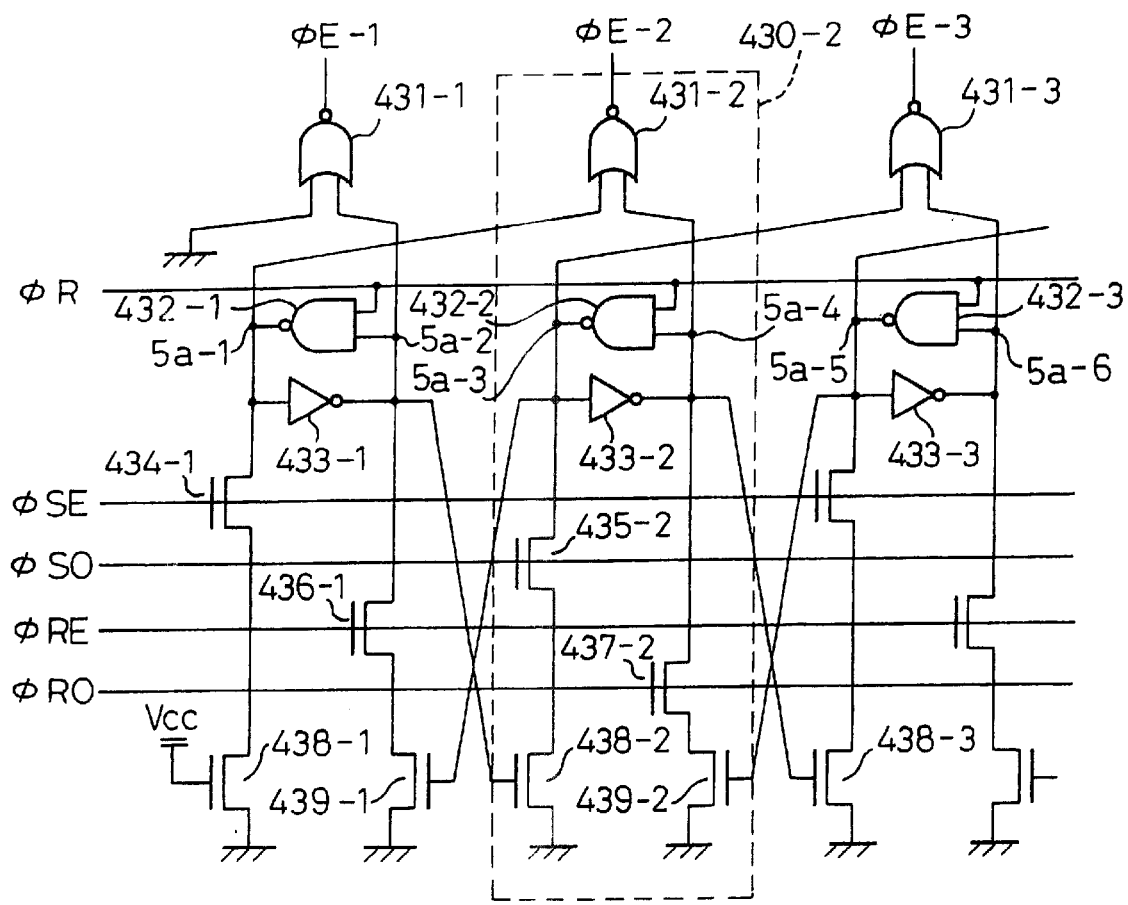
FIG. 26 is a diagram showing a configuration of a delay control circuit according to the sixth embodiment.
Figure 27:
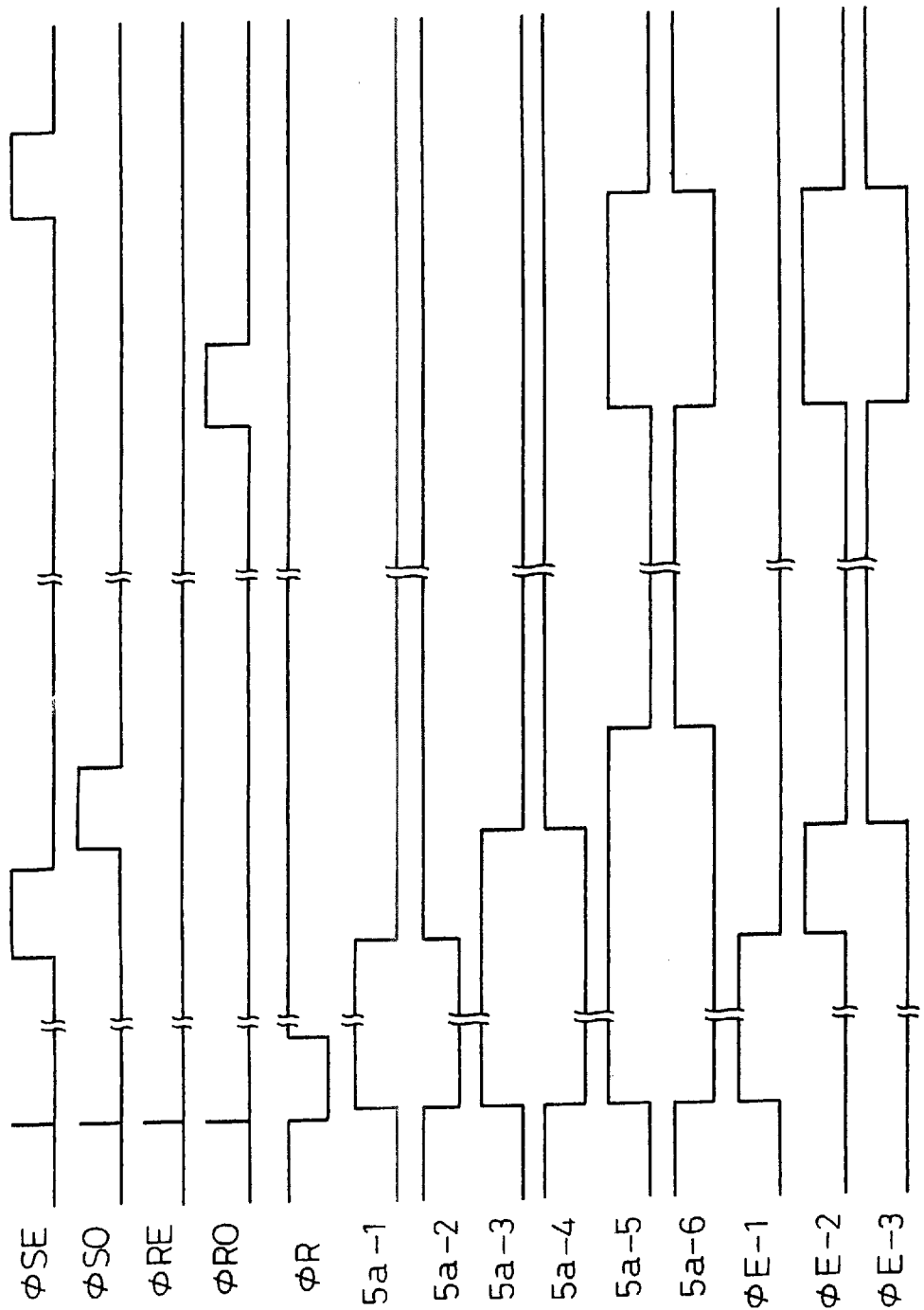
FIG. 27 is a time chart showing the operation of a delay control circuit according to the sixth embodiment.

FIG. 26 is a diagram showing the circuitry of a delay control circuit 304, and FIG. 27 is a timing chart showing the operations thereof. As shown in FIG. 26, the delay control circuit 304 has a delay control circuit 430-2 for handling one bit, which is encircled with a dashed line, connected by the number of the plurality of stages of delay circuits. An output of each stage is the activation signal φE to be applied to each stage of a delay circuit.

The delay control circuit 430-2 for handling one bit has transistors 435-2, 437-2, 438-2, and 439-2 connected in series with one another to both terminals of a flip-flop composed of a NAND circuit 432-2 and inverter 433-2, and further includes a NOR circuit 431-2. The gate of the transistor 438-2 is connected to a terminal 5a-2 of a delay control circuit of a preceding stage. The gate of the transistor 439-2 is connected to a terminal 5a-5 of a delay control circuit of a succeeding stage. Thus, signals provided by the preceding and succeeding stages are received. A set signals φSE and φSO used for a counting-up operation are applied alternately to every other delay control circuit. A reset signals φRE and φRO used for a counting-down operation are applied alternately to every other delay control circuit. As illustrated, in the delay control circuit 430-2 for handling one bit located in the center, the transistor 435-2 is connected on a signal line over which the signal φSO is transmitted and the transistor 437-2 is connected on a signal line over which the signal φRO is transmitted. The equivalent transistors of the delay control circuits on both sides of the delay control circuit 430-2 are connected on the signal lines φSE and φRE. Signals developing at a terminal 5a-1 of the left-hand delay control circuit and at a terminal 5a-4 of the center delay control circuit are input to the NOR circuit 431-2. A signal φR is a signal for resetting a delay control circuit. After the power supply is turned on, the signal φR is driven low temporarily. Thereafter, the signal φR is fixed high.

FIG. 27 is a diagram showing the operations of the delay control circuit shown in FIG. 26.

First, the signal φR is driven low temporarily. The potentials at the terminals 5a-1, 5a-3, and 5a-5 are driven high, and the potentials at the terminals 5a-2, 5a-4, and 5a-6 are reset to low. For a counting-up operation, the counting-up signals φSE and φSO go high and low alternately repeatedly. When the signal φSE makes a low-to-high transition, the terminal 5a-1 is grounded to have the potential thereof driven low, and the potential at the terminal 5a-2 is driven high. When the potential at the terminal 5a-2 is driven high, the signal φE-1 makes a high-to-low transition. This state is latched by the flip-flop Even when the signal 6SE goes back to low, the output φE-1 remains low. When the potential at the terminal 5a-1 is driven low, the output φE-2 makes a low-to-high transition. Since the potential at the terminal 5a-2 is driven high, the transistor 438-2 is turned on. When the signal φSO makes a low-to-high transition, the terminal 51-3 is grounded to have the potential thereof driven low, and the potential at the terminal 5a-4 is driven high. When the potential at the terminal 5a-4 is driven high, the signal φE-2 makes a high-to-low transition. Since this state is latched by the flip-flop, even if the signal φSO goes back to low, the output φE-2 remains low. When the potential at the terminal 5a-3 is driven low, the output φE-3 makes a low-to-high transition. In the drawing, only one of the pulses φSE and φSO is output. Since many stages of delay control circuits are connected, when the signals φSE and φSO go high and low alternately repeatedly, a stage whose output φE goes high is shifted sequentially rightward. When it is judged from the result of comparison performed by the phase comparison circuit 42 that the magnitude of a delay should be increased, the pulses 6SE and 6SO are input alternately.

If a state in which the counting-up signals φSE and φSO and the counting-down signals φRE and φRO are not output, that is, remain low is retained, a stage whose output φE goes high is fixed. When it is judged from the result of comparison performed by the phase comparison circuit 42 that the magnitude of a delay should be retained intact, the pulses φSE, φSO, φRE, and φRO are not input.

For a counting-down operation, the pulses φRE and φRO are input alternately. On the contrary to the counting-up operation, a stage whose output φE goes high is shifted sequentially leftward.

As mentioned above, in the delay control circuit shown in FIG. 26, a stage whose output φE goes high can be shifted one by one with input of pulses. When the delay circuit shown in FIG. 25C is controlled using outputs φE, the magnitude of a delay can be increased or decreased in units of one unit value.

Figure 28:
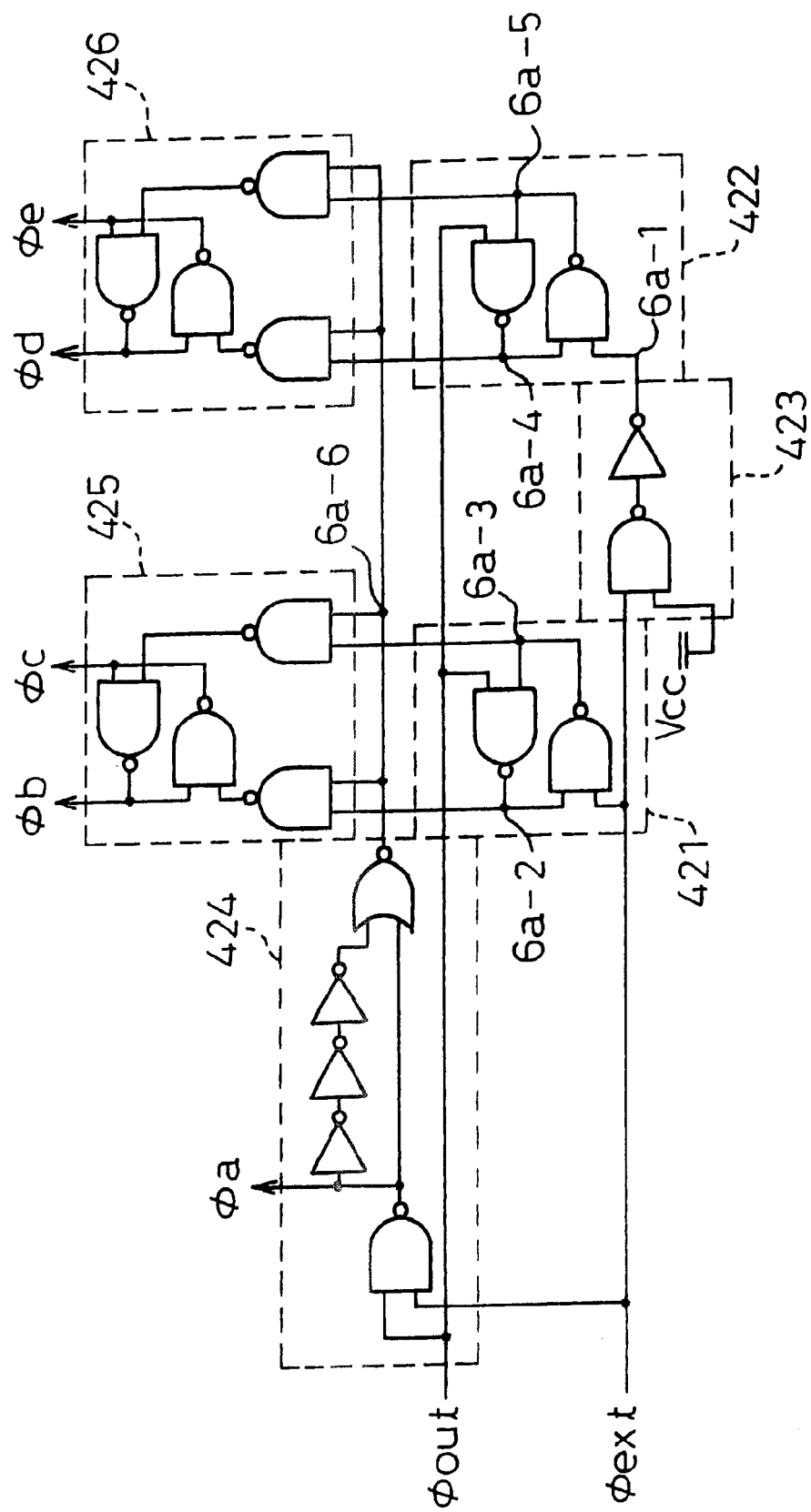
FIG. 28 is a diagram showing a configuration of a phase comparator circuit (phase comparator) according to the sixth embodiment.
Figure 30:
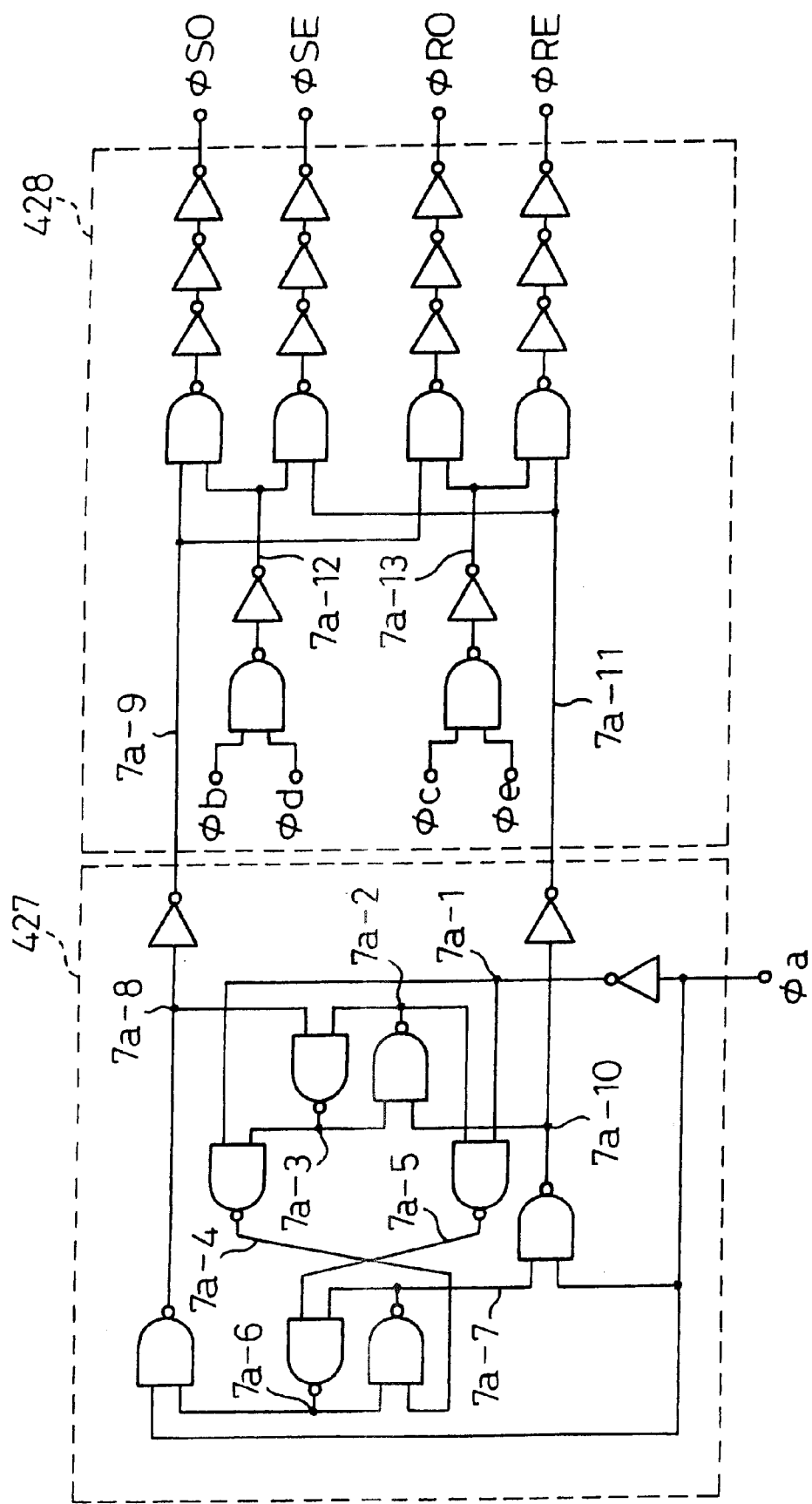
FIG. 30 is a diagram showing a configuration of a phase comparator circuit (amplifier circuit) according to the sixth embodiment.
Figure 31:
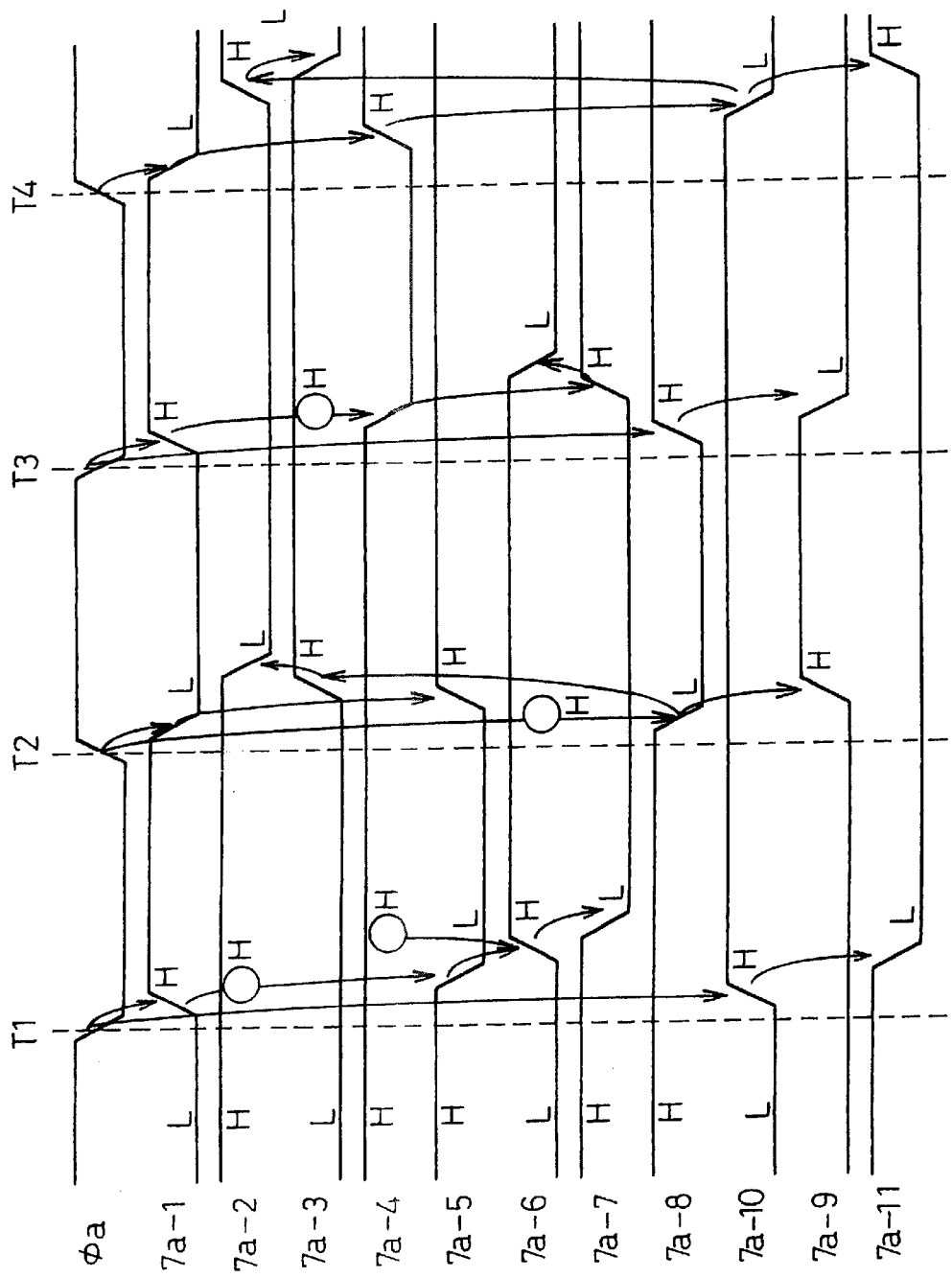
FIG. 31 is a time chart showing the operation of a phase comparator circuit (JK flip-flop) according to the sixth embodiment.

The phase comparison circuit 303 is composed of two circuits; a phase comparator and amplifier unit. FIG. 28 is a diagram showing the circuitry of the phase comparator, FIGS. 29A to 29C are timing charts showing the operations of the phase comparator, FIG. 30 is a diagram showing the circuitry of the amplifier unit, and FIG. 31 is a timing chart showing the operations of the amplifier unit.

In FIG. 28, there are shown an output signal φout and external clock next which are compared by the phase comparison circuit 303. The phase of the output φout is judged with reference to that of the clock next. Output signals φa to φe are supplied to the amplifier unit. As shown in FIG. 28, the phase comparator consists of flip-flops 421 and 422 each composed of two NAND circuits, latches 425 and 426 for latching the states of the flip-flops, a circuit 424 for generating an activation signal for the latches, and a delay circuit 423 for providing the permissible value of the phase of the external clock φext and producing one delay.

Figure 29:
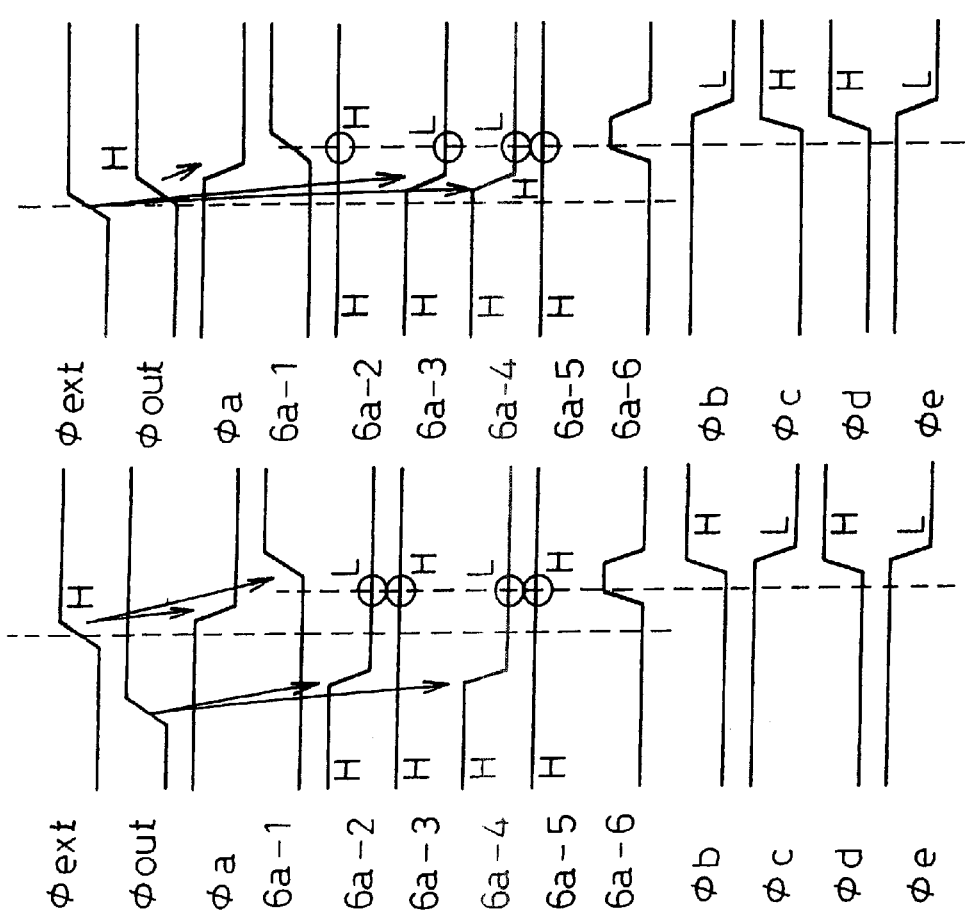
FIGS. 29A to 29C are time charts showing the operation of a phase comparator circuit (phase comparator) according to the sixth embodiment.

FIG. 29A shows a situation in which the object-of-comparison signal φout is leading the reference-of-comparison signal next and the signal φout makes a low-to-high transition earlier than the signal φext. When both the signals φout and φext are low, the potentials at the terminals 6a-2, 6a-3, 6a-4, and 6a-5 of the flip-flops 421 and 422 are high. When the output φout makes a low-to-high transition, the terminals 6a-2 and 6a-4 make a high-to-low transition. Thereafter, the signal φext makes a low-to-high transition. The time corresponding to one delay later, a terminal 6a-1 makes a low-to-high transition. However, since the potentials across the flip-flops are already finalized, no transition occurs. The terminal 6a-2 remains low, the terminal 6a-3 remains high, the terminal 6a-4 remains low, and the terminal 6a-5 remains high. When the signal φext makes a low-to-high transition, the output signal φa of the circuit 424 makes a low-to-high transition. A high-level pulse is applied temporarily to a terminal 6a-6. Since the terminal 6a-6 is connected to NAND circuits of the latches 425 and 436, the NAND circuits are activated temporarily. The potentials across the flip-flops 421 and 422 are therefore fetched into the latches 425 and 426. Finally, the output signal φb goes high, the output signal φc goes low, the output signal φd goes high, and the output φe goes low.

Next, FIG. 29B shows a situation in which the object-of-comparison signal φout is substantially in phase with the reference-of-comparison signal φext and the signal φout makes a low-to-high transition substantially simultaneously with the signal φext. The signal φout makes a low-to-high transition within a time interval between the rise time instant of the signal φout and the rise time instant of the potential at the terminal 6a-1. In this case, when the signal φext makes a low-to-high transition, the potential at the terminal 6a-3 of the flip-flop 421 makes a low-to-high transition. However, the potential at the terminal 6a-1 of the flip-flop 422 remains low and the potential at the terminal 6a-4 makes a high-to-low transition. Thereafter, the potential at the terminal 6a-1 makes a high-to-low transition. However, since the state of the flip-flop 422 is already finalized, no transition occurs. Thereafter, the terminal 6a-6 is driven high temporarily, the state is latched by the latch. Finally, the output signal φb goes low, the output signal φc goes high, the output signal φd goes high, and the output signal φe goes low.

FIG. 29C shows a situation in which the object-of-comparison signal φout lags behind the reference-of-comparison signal next and the signal φout makes a low-to-high transition later than the signal φext. In this case, the signal φext causes the flip-flops 421 and 422 to make a state transition. The potentials at the terminals 6a-3 and 6a-5 make high-to-low transitions. Finally, the output signal φb goes low, the output signal φc goes high, the output signal φd goes low, and the output signal φe goes high.

Thus, it becomes possible to detect using the rise time instant of the signal φext as a reference whether the signal φout goes high earlier, nearly simultaneously, or later. The result of the detection is latched by setting the output signals φb, φc, φd, and φe to specific values. Based on the values, it is determined whether either a counting-up or counting-down operation should be carried out in order to select a stage of the delay control circuit.

FIG. 30 is a diagram showing the circuitry of the amplifier unit of the phase comparison circuit 303.

The amplifier unit consists of two blocks; a JK flip-flop 427 and an amplifier 428 composed of NAND circuits and inverters. The JK flip-flop 427 inputs a signal from the phase comparator shown in FIG. 16. Depending on whether the signal φa is low or high, the potentials at terminals 7a-9 and 7a-11 go low and high alternately and repeatedly. The amplifier 428 amplifies and outputs an output signal of the JK flip-flop 427 according to the signals φb to φd.

To begin with, the operations of the JK flip-flop 427 will be described with reference to the timing chart of FIG. 31. When the signal φa makes a high-to-low transition at a time instant T1, the potential at a node 7a-10 makes a low-to-high transition. With the state transition of the potential at a node 7a-1 the potentials at terminals 7a-1, 7a-6, and 7a-7 make a state transition. However, since the signal φa is low, the potential at a node 7a-8 does not make a state transition. Consequently, an output 7a-9 makes no state transition. Only an output 7a-11 makes a low-to-high transition. Thereafter, when the signal φa makes a low-to-high transition at a time instant T2, the potential at a node 7a-8 makes a high-to-low transition opposite to that at the time instant T1. The potential at the node 7a-10 makes no state transition because the potential at a terminal 7a-7 makes no state transition. The output 7a-9 makes a low-to-high transition, while the output 7a-11 makes no state transition. Thus, the outputs 7a-9 and 7a-11 of the JK flip-flop 427 go high and low alternately and repeatedly in responsive to the state transition of the signal φa.

Figure 32:
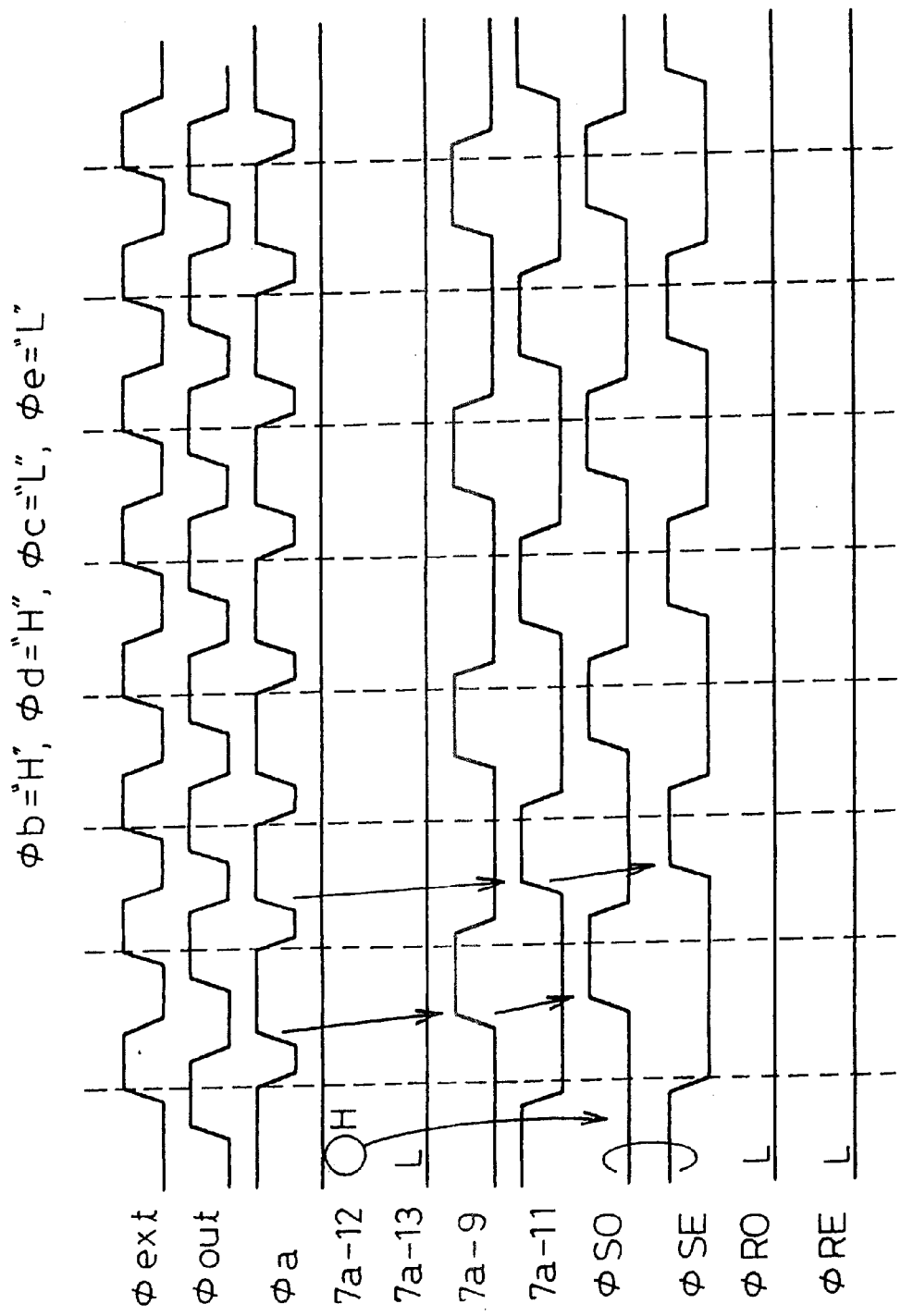
FIG. 32 is a time chart showing the operation of a phase comparator circuit (amplifier circuit) according to the sixth embodiment.

Next, the operations of the amplifier 428 will be described with reference to FIGS. 32 to 34. FIG. 32 shows a situation in which the object-of-comparison signal φout makes a low-to-high transition earlier than the rise of the reference-of-comparison signal φext. The input signal φb sent from the phase comparator goes high, the input signal φc goes low, the input signal φd goes high, and the input signal φe goes low. Consequently, the potential at a terminal 7a-12 is fixed to high and the potential at a terminal 7a-13 is fixed to low. The signals φSO and φSE make a state transition according to the state of the JK flip-flop. However, the signals φRO and φRE make no state transition because the potential at the terminal 7a-13 is low.

Figure 33:
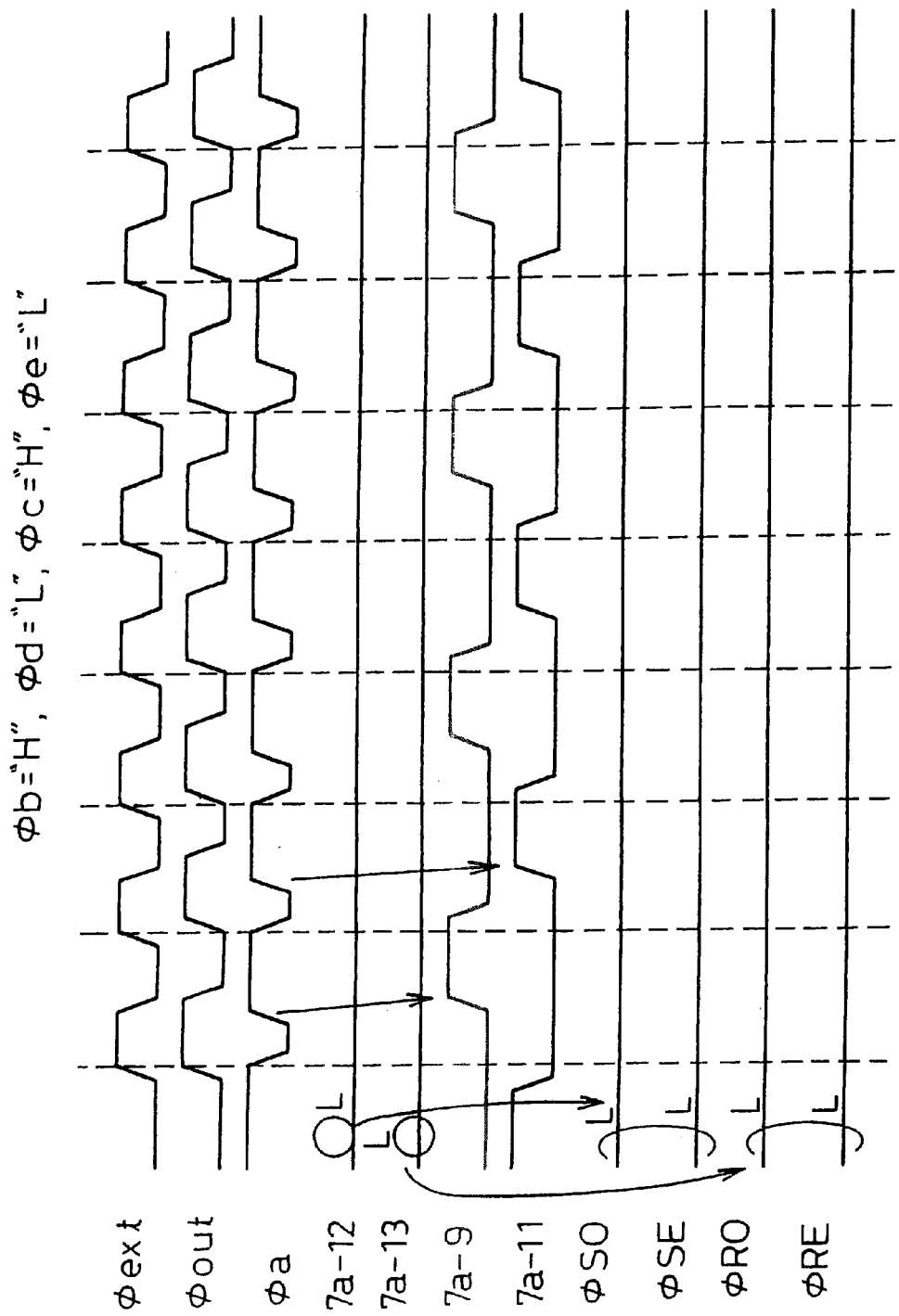
FIG. 33 is a time chart showing the operation of a phase comparator circuit (amplifier circuit) according to the sixth embodiment.

FIG. 33 shows a situation in which the object-of-comparison signal φout and reference-of-comparison signal φext make a low-to-high transition nearly simultaneously. The signal input from the phase comparator, φb, is low, the input signal φc is high, the input signal φd is high, and the input signal φe is low. Consequently, the potentials at the terminals 7a-12 and 7a-13 are fixed to low. The output of the JK flip-flow will not affect an output of the amplifier, and the signals φSO, φSE, φRO, and φRE remain low.

Figure 34:
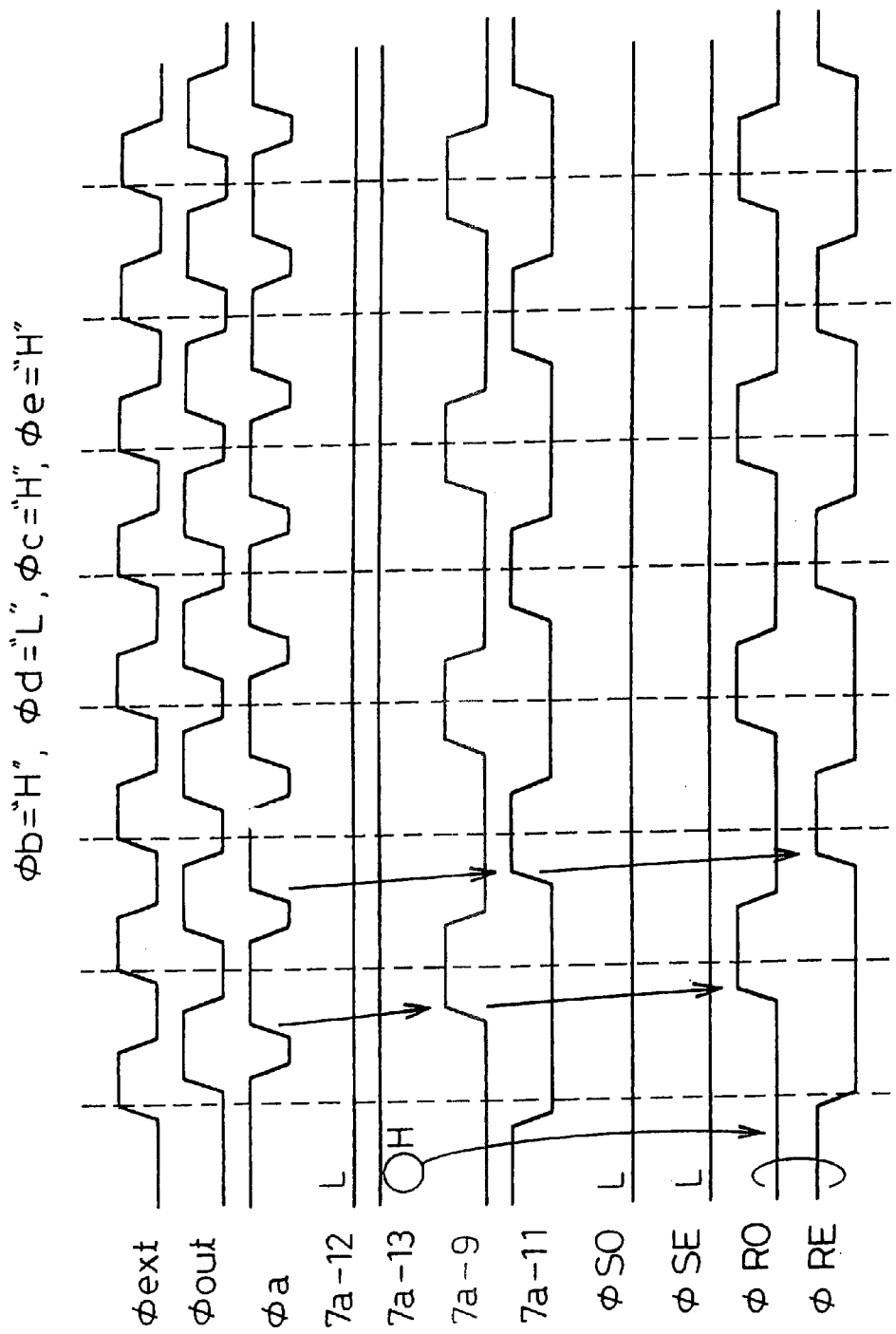
FIG. 34 is a time chart showing the operation of a phase comparator circuit (amplifier circuit) according to the sixth embodiment.

FIG. 34 shows a situation in which the object-of-comparison signal φout makes a low-to-high transition later than the rise of the reference-of-comparison signal next. In this case, the signal input from the phase comparator, φb, is low, the input signal φc is high, the input signal φd is low, and the input signal φe is high. Consequently, the potential at the terminal 7a-12 is fixed to low and the potential at the terminal 7a-13 is fixed to high. The signals φRO and φRE make a state transition according to the state of the JK flip-flop. The signals φSO and φSE make no state transition because the potential at the terminal 7a-13 is low.

In the above-mentioned configuration according to the sixth embodiment, an internal clock exactly in phase with the leading edges of two external clocks exactly 180° out of phase with each other is supplied to a data output buffer. The output data, therefore, undergoes a change in exact synchronism with the leading edges of the two external clocks alternately. In other words, an accurate data output according to the DDR scheme free of phase deviation is realized.

The 0° (360°) DLL circuit according to the sixth embodiment can be used as the 0° DLL circuits 25, 26 according to the second embodiment shown in FIG. 13 and the third embodiment shown in FIG. 17, respectively. The DLL circuit can be configured in various other ways and can be used with equal effect. In addition, a PLL circuit can be used as an alternative.

Figure 35:
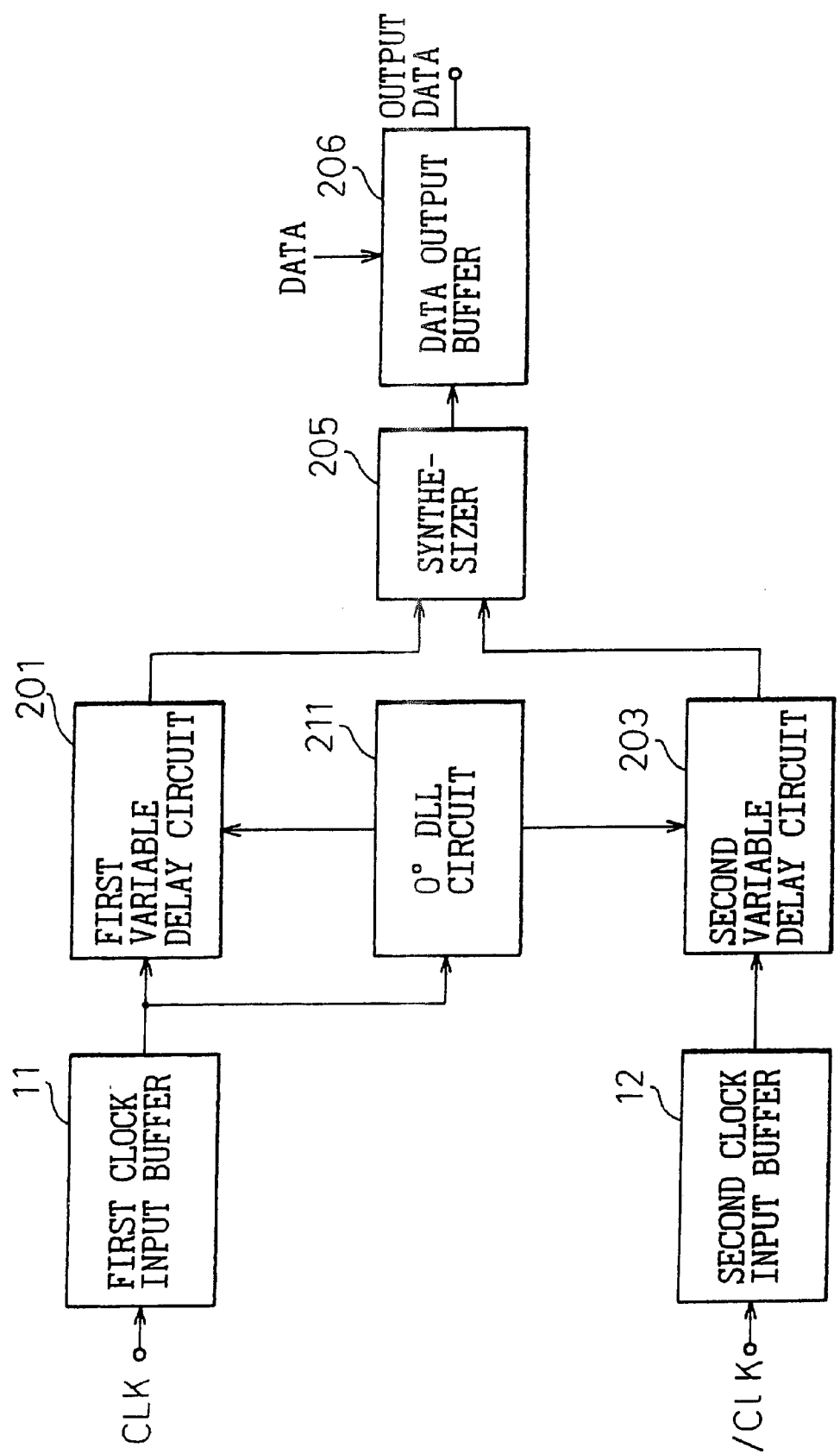
FIG. 35 is a diagram showing a configuration of an output clock generating circuit according to a seventh embodiment.

FIG. 35 is a diagram showing a configuration of an output clock generating circuit according to a seventh embodiment. The seventh embodiment is applicable to the case in which the leading edges of the first and second external clocks CLK, /CLK are exactly 180° out of phase from each other, and is different from the sixth embodiment in that the first and second 0° DLL circuits 202, 204 are combined into a single 0° DLL circuit 211. In the case where the leading edges of the first and second external clocks CLK, /CLK are exactly 180° out of phase from each other, the first and second variable delay circuits 201, 203 have the same delay amount. In view of this, according to the seventh embodiment, the first and second 0° DLL circuits 202, 204 are unified thereby to simplify the circuit configuration.

According to the sixth and seventh embodiments, the delay amounts of the two internal clocks output from the first and second clock input buffers 11, 12 are adjusted before synthesis. In the case where the leading edges of the first and second external clocks CLK, /CLK are exactly 180° out of phase from each other, however, phase adjustment is possible after synthesizing the two internal clocks.

Figure 36:
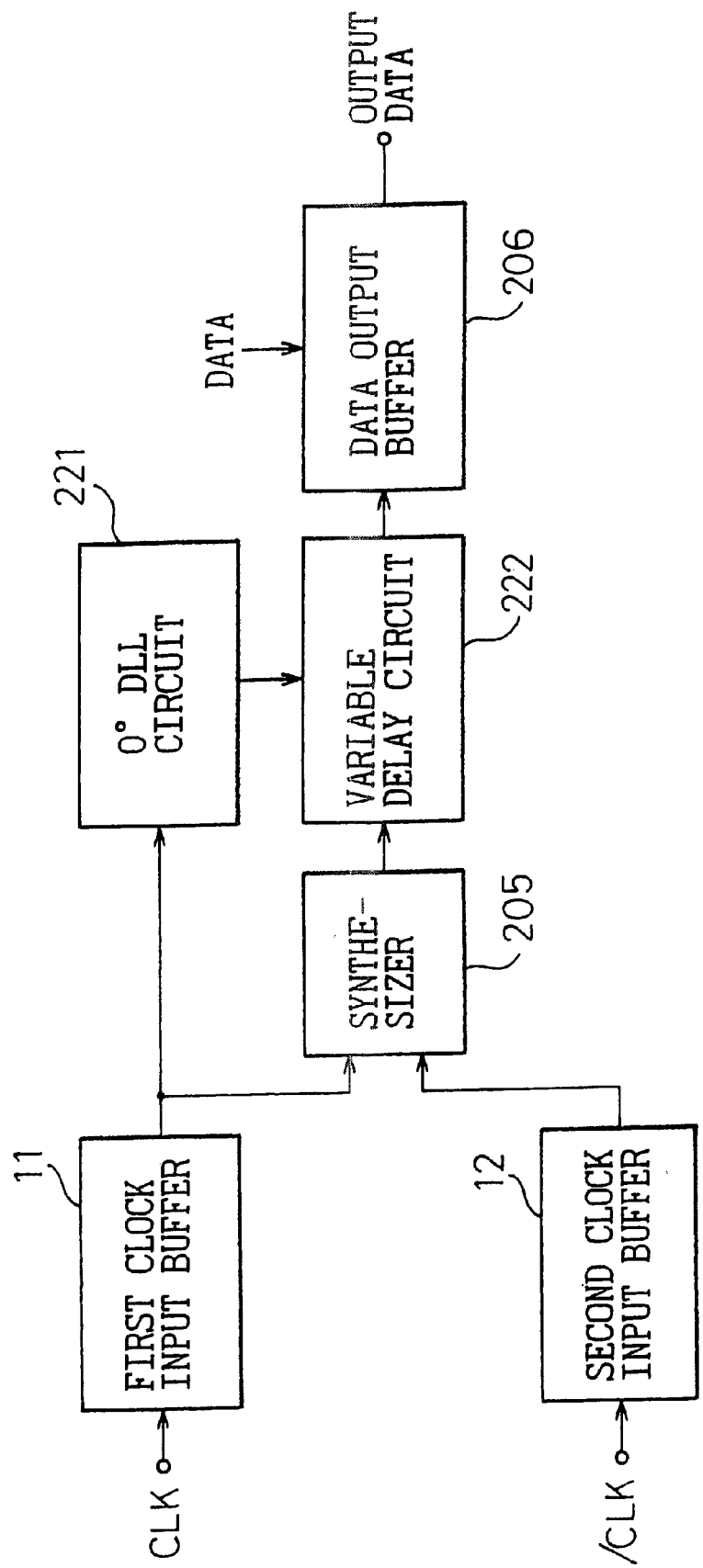
FIG. 36 is a diagram showing a configuration of an output clock generating circuit according to an eighth embodiment.

FIG. 36 is a diagram showing a configuration of an output clock generating circuit according to an eighth embodiment. As shown in FIG. 36, the circuit according to the eighth embodiment is such that the two internal clocks output from the first and second clock input buffers 11, 12 are synthesized by a synthesizer 205 before being applied to a variable delay circuit 222. The delay amount in the variable delay circuit 222 is controlled by the 0° DLL circuit 222 in the same manner as in the sixth and seventh embodiments. The variable delay circuit 222 has the same configuration as the first and second variable delay circuits 201, 203. Similarly, the 0° DLL circuit 221 has the same configuration as the first and second 0° DLL circuits 202, 204 and the 0° DLL circuit 211.

According to the seventh embodiment, two variable delay circuits are used including the first and second variable delay circuits 201, 203. The eighth embodiment, however, uses only one variable delay circuit 222 and is even simpler in configuration than the seventh embodiment.

Figure 37:
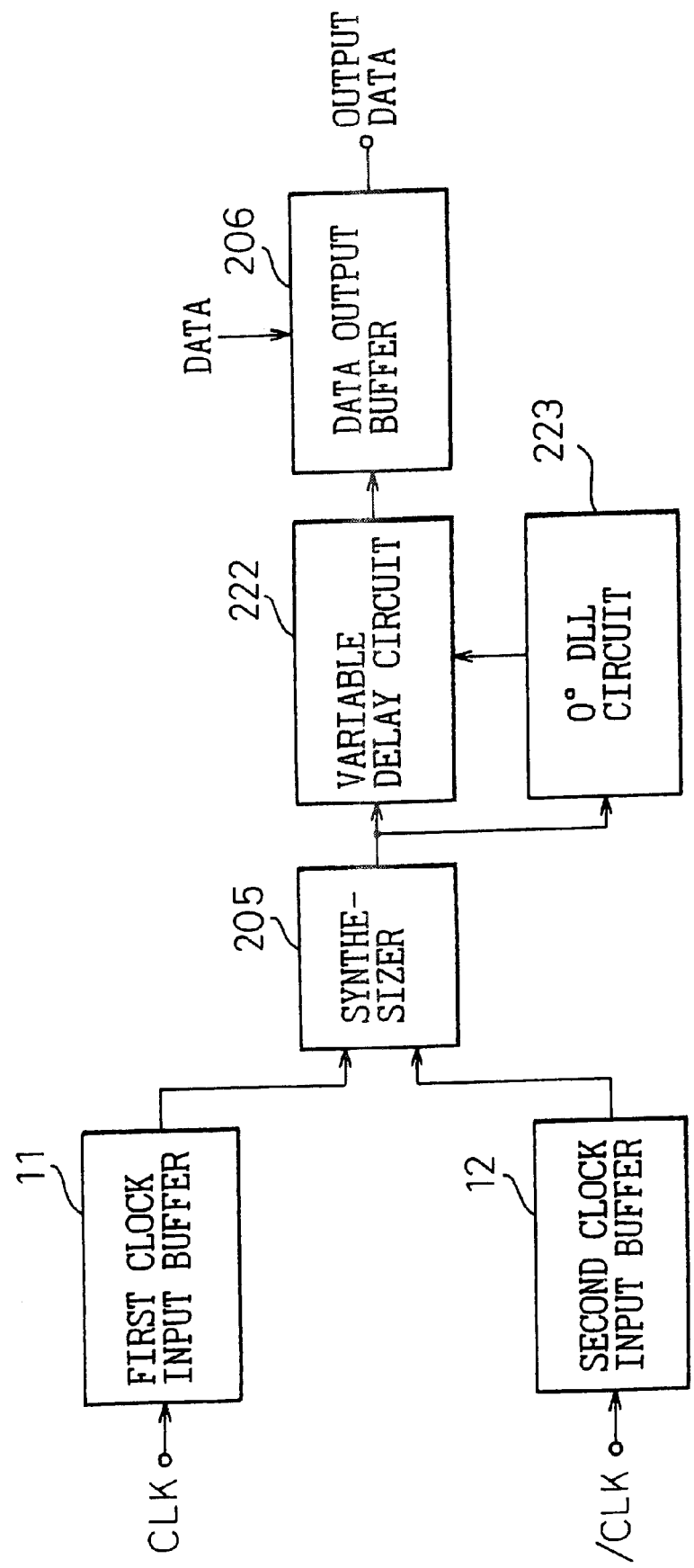
FIG. 37 is a diagram showing a configuration of an output clock generating circuit according to a ninth embodiment.

FIG. 37 is a diagram showing a configuration of an output clock generating circuit according to a ninth embodiment. Comparison with FIG. 36 apparently shows that this embodiment is different from the eighth embodiment in that a 0° DLL circuit 223 is provided in place of the 0° DLL circuit 221. The 0° DLL circuit 223 detects the phase difference from a signal input thereto from the output of the synthesizer 205 and controls the delay amount of the variable delay circuit 222. The 0° DLL circuit 223 has the same configuration as the 0° DLL circuit 221 but is different in that a clock signal of a frequency twice as.high is synthesized and supplied by the synthesizer 205. The same operation can be realized, however, by doubling the dividing ratio of the 1/N frequency divider.

It will thus be understood from the foregoing description that a semiconductor device according to the present invention can be used with both a system of a type using a complementary clock and a system of a type generating a 180° phase signal internally, and therefore is not required to have different specifications for the two different types of the system. Manufacturers producing this semiconductor, therefore, can improve the production efficiency and can control the inventory more easily for a lower cost. Also, since the component parts can be shared, system manufacturers using such a semiconductor device can enjoy an easier inventory control and a lower cost.

In a semiconductor device of DDR scheme, data can be input or output exactly in synchronism with two external clocks complementary with each other.

What is claimed is:

1. A signal input state detection circuit for detecting whether a small-amplitude signal is input or not, comprising:

a first inverter including a first P-channel transistor and a first N-channel transistor inserted in series between a high-voltage terminal and a low-voltage terminal of a power supply, said small-amplitude signal being applied to the gate of said first P-channel transistor and the gate of said first N-channel transistor, said first P-channel transistor having a gate width sufficiently larger than the gate width of said first N-channel transistor;

a second inverter including a second P-channel transistor and a second N-channel transistor inserted in series between said high-voltage terminal and said low-voltage terminal of said power supply, said small-amplitude signal being applied to the gate of said second P-channel transistor and the gate of said second N-channel transistor, said second N-channel transistor having a gate width sufficiently larger than the gate width of said second P-channel transistor; and a logic circuit for producing an active signal indicating that said small-amplitude signal is input upon detection that the output of said first inverter assumes a logical value approximate to the potential of said high-voltage terminal and upon detection that the output of said second inverter assumes a logical value approximate to the potential of said low-voltage terminal.

* * * * *